US012676627B2

(12) United States Patent
Hwang et al.

(10) Patent No.: US 12,676,627 B2
(45) Date of Patent: Jul. 7, 2026

(54) ANALOG-TO-DIGITAL CONVERTER AND SEMICONDUCTOR DEVICE HAVING THE SAME

(71) Applicant: LX SEMICON CO., LTD., Daejeon (KR)

(72) Inventors: Won Joon Hwang, Daejeon (KR); Hai Feng Jin, Daejeon (KR); Ju Pyo Hong, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 91 days.

(21) Appl. No.: 18/537,334

(22) Filed: Dec. 12, 2023

(65) Prior Publication Data

US 2024/0195430 A1 Jun. 13, 2024

(30) Foreign Application Priority Data

Dec. 13, 2022 (KR) ........................ 10-2022-0173352
Sep. 7, 2023 (KR) ........................ 10-2023-0118713

(51) Int. Cl.
*H03M 1/10* (2006.01)
*H03M 1/46* (2006.01)

(52) U.S. Cl.
CPC .................................. H03M 1/466 (2013.01)

(58) Field of Classification Search
CPC .................................................. H03M 1/466
USPC ................ 341/144, 161, 155, 156, 122, 145
See application file for complete search history.

(56) References Cited

U.S. PATENT DOCUMENTS

| | | | |
|---|---|---|---|
| 10,097,198 B1 | 10/2018 | Lee et al. | |
| 10,917,105 B1 * | 2/2021 | Ayman | ................... H03L 7/0812 |
| 10,938,401 B1 * | 3/2021 | Olieman | ............... H03M 1/462 |

OTHER PUBLICATIONS

Extended European Search Report dated May 7, 2024, issued for the corresponding European patent application No. 23215567.1, 13 pages.
Shan et al., "A 12-bit 1MS/s Non-calibrating SAR A/D Converter Based on 90nm CMOS Process," Machine Vision and Human-Machine Interface (MVHI), 2010 International Conference on, IEEE, Piscataway, NJ, US, Apr. 24, 2010, pp. 784-787, XP031720496.

(Continued)

*Primary Examiner* — Peguy Jean Pierre
(74) *Attorney, Agent, or Firm* — ROTHWELL, FIGG, ERNST & MANBECK, P.C.

(57) ABSTRACT

The present disclosure relates to an analog-to-digital converter that minimizes or prevents a loss of charges charged in a capacitor array by controlling a switching sequence of switches when switching phases. The analog-to-digital converter includes a DAC circuit including a CDAC circuit and a RDAC circuit, a comparator that compares an output voltage of the DAC circuit with a common mode voltage and outputs a comparison result, and a control logic circuit that controls a switch operation of the DAC circuit and the comparison operation of the comparator in a sampling phase and a comparison phase, outputs digital data based on the comparison result of the comparator, and controls switches that apply the common mode voltage and first and second reference voltages to the capacitor array in the CDAC circuit in response to that the sampling phase is switched to the comparison phase based on a specific switching timing sequence.

18 Claims, 26 Drawing Sheets

(56) References Cited

OTHER PUBLICATIONS

Ni et al., "Mixed capacitor switching scheme for SAR ADC with highest switching energy efficiency," Electronics Letters, The Institution of Engineering and Technology, GB, vol. 51, No. 6, Mar. 19, 2015, pp. 466-467, XP006051222.

An et al., "A Two-channel 10b 160 MS/s 28 nm CMOS Asynchronous Pipelined-SAR ADC with Low Channel Mismatch," Journal of Semiconductor Technology and Science, vol. 17, No. 5, Sep. 8, 2016, pp. 636-647, XP055815266, retrieved from the Internet URL:https://ieeexplore.ieee.org/stamp/stamp.jsp?tp=&arnumber=7546838 on Jun. 17, 2021.

Leow et al., "A 1 V 103 dB 3rd-Order Audio Continuous-Time $\Delta\Sigma$ ADC With Enhanced Noise Shaping in 65 nm CMOS," IEEE Journal of Solid-State Circuits, IEEE, US, vol. 51, No. 11, Nov. 1, 2016, pp. 2625-2638, XP011626616.

\* cited by examiner

FIG. 2

ANALOG-TO-DIGITAL CONVERTER AND SEMICONDUCTOR DEVICE HAVING THE SAME

This application claims the benefit of Korean Patent Application Nos. 10-2022-0173352 filed on Dec. 13, 2022 and 10-2023-0118713 filed on Sep. 7, 2023, all of which are hereby incorporated by reference it their entirety as if fully set forth herein.

BACKGROUND

Field

The present disclosure relates to an analog-to-digital converter and a semiconductor device having the same that may minimize or prevent a loss of charges charged in a capacitor array when switching phases.

Discussion of the Related Art

An electronic device includes an analog-to-digital converter (ADC) that converts an analog signal into digital data as a basic component.

For example, the ADC may be built into a micro controller unit (MCU) and may convert the analog signal into the digital data. The ADC may convert the analog signal sensed via a sensor into the digital data for digital signal processing.

Among analog-digital conversion schemes, a successive approximation register (SAR) ADC, which quantizes the analog signal using a binary search scheme, is mainly used.

The moment the SAR ADC switches from a sampling phase to a comparison phase, switches connected to capacitors may not switch simultaneously because of a switching timing error. In this case, charges charged in the capacitors may be lost via a common switch that is turned off.

In addition to the successive approximation register (SAR) described above, types of ADC include a pipelined ADC, an algorithmic ADC, and the like.

The SAR is mainly described in the present document, but the technical ideas of the present disclosure are applicable to various ADC technologies.

SUMMARY

The present disclosure is to provide an analog-to-digital converter and a semiconductor device having the same that may minimize or prevent a loss of charges charged in a capacitor array by controlling a switching sequence of switches when changing phases.

A first aspect of the present disclosure provides an analog-to-digital converter including a digital-to-analog converter (DAC) circuit including a capacitor digital-to-analog converter (CDAC) circuit including a capacitor array, and a resistor digital-to-analog converter (RDAC) circuit including a resistor string, a comparator that compares an output voltage of the DAC circuit with a common mode voltage and outputs a comparison result, and a control logic circuit that controls a switch operation of the DAC circuit and the comparison operation of the comparator in a sampling phase and a comparison phase, outputs digital data based on the comparison result of the comparator, and controls switches that apply the common mode voltage and first and second reference voltages to the capacitor array in the CDAC circuit in response to that the sampling phase is switched to the comparison phase based on a specific switching timing sequence.

A second aspect of the present disclosure provides an analog-to-digital converter including a DAC circuit including a CDAC circuit and an RDAC circuit, a comparator that compares an output voltage of the DAC circuit with a common mode voltage and outputs a comparison result, and a control logic circuit that controls a switch operation of the DAC circuit and the comparison operation of the comparator in a sampling phase and a comparison phase, outputs digital data based on the comparison result of the comparator, and sequentially turns on switches that apply the common mode voltage and first and second reference voltages to a capacitor array in the CDAC circuit in response to that the sampling phase is switched to the comparison phase from a switch connected to a minimum capacitor having a minimum capacitance to a switch connected to a maximum capacitor having a maximum capacitance.

A third aspect of the present disclosure provides a semiconductor device including the analog-to-digital converter.

The SAR ADC according to the embodiment of the present disclosure may control the switching timing sequence of the switches that apply the common mode voltage and the first and second reference voltages when switching from the sampling phase to the comparison phase depending on the channel type of the switch, thereby minimizing or preventing the charges charged in the capacitor array from being lost via the common switch that is turned off.

The SAR ADC according to the embodiment of the present disclosure may minimize or prevent the charge loss of the capacitor array when starting the comparison phase, thereby preventing the error of the digital code determined via the comparator and outputting the accurate digital data.

The semiconductor device using the SAR ADC according to the embodiment of the present disclosure may improve the operational reliability by receiving the accurate digital data via the SAR ADC.

BRIEF DESCRIPTION OF THE DRAWINGS

FIG. 2 is a circuit diagram specifically showing a SAR ADC according to an embodiment of the present disclosure.

DESCRIPTION OF SPECIFIC EMBODIMENTS

Figure 1:
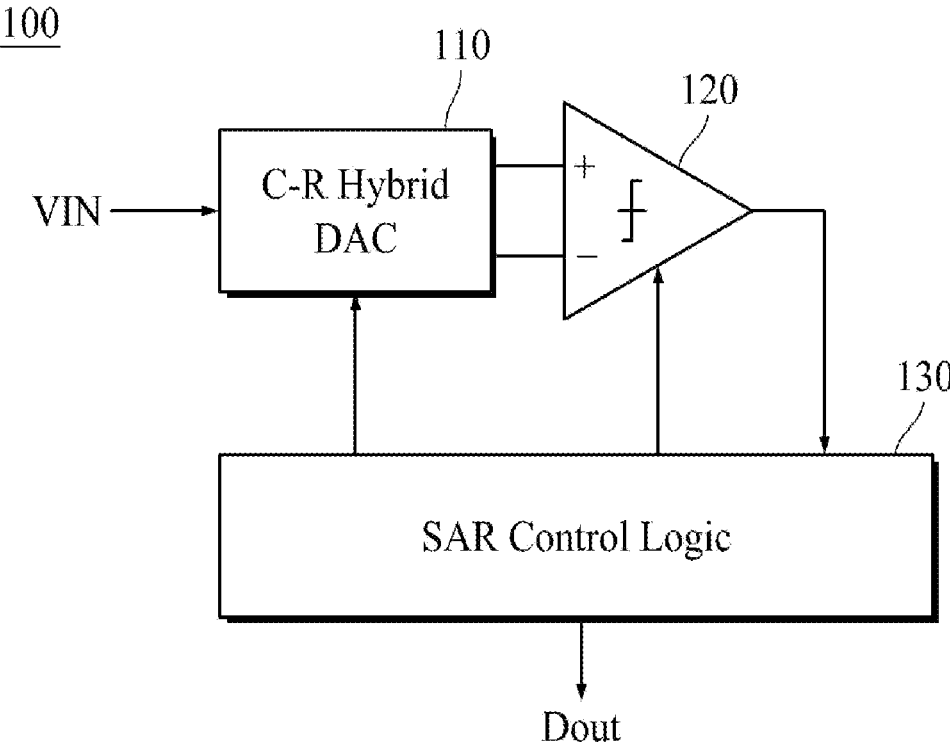
FIG. 1 is a block diagram schematically showing a SAR ADC according to an embodiment of the present disclosure.

Like reference numerals refer to substantially the same components throughout the present document. In a following description, when it is not related to the core composition of the present disclosure, detailed descriptions of the composition and functions known in the technical field of the present disclosure may be omitted. The meaning of terms described herein should be understood as follows.

The advantages and features of the present disclosure, and methods for achieving them, will become clear with reference to the embodiments described in detail below along with the accompanying drawings. However, the present disclosure will not be limited to the embodiments disclosed below and will be implemented in various different forms. The present embodiments only ensure that the disclosure of the present disclosure is complete, and are provided to fully inform those skilled in the art of the present disclosure of the scope of the present disclosure. The present disclosure is only defined by the scope of the claims.

Like reference numerals refer to like components throughout the present document. Additionally, when describing the present disclosure, when it is judged that a detailed description of the related known technology may unnecessarily obscure the gist of the present disclosure, the detailed description thereof will be omitted.

When the terms 'include', 'have', 'composed of', and the like mentioned herein are used, other components may be added unless the term 'only' is used. When a component is expressed in the singular, the plural case is included unless specifically stated otherwise.

In descriptions of temporal relationships, for example, temporal precedent relationships between two events such as "after", "subsequent to", "before", etc., another event may occur therebetween unless "immediately" or "directly" is indicated.

Although first, second, and the like are used to describe various components, such components are not limited by these terms. These terms are merely used to distinguish one component from another. Accordingly, the first component mentioned below may be the second component within the technical idea of the present disclosure.

The term "at least one" should be understood to include all possible combinations presented from one or more related items. For example, "at least one of first, second, and third items" may mean combinations of all items that may be presented from two or more of the first, second, and third items as well as each of the first, second, or third items.

Respective features of the various embodiments of the present disclosure may be coupled or combined with each other, partially or entirely, and various technological interconnections and operations are possible. The embodiments may be implemented independently of each other or together in a related relationship.

Hereinafter, preferred embodiments of the present document will be described in detail with reference to the attached drawings.

FIG. 1 is a block diagram schematically showing a SAR ADC according to an embodiment of the present disclosure.

Referring to FIG. 1, a SAR ADC 100 according to one embodiment may include a capacitor-resistor (hereinafter, C-R) hybrid digital-to-analog converter (DAC) circuit 110, a comparator 120, and a successive approximation register (hereinafter, SAR) control logic circuit 130. The SAR ADC 100 may receive an input voltage VIN, convert the input voltage into digital data Dout, and output the digital data.

The C-R hybrid DAC circuit 110 may include a capacitor DAC (hereinafter, referred to as CDAC) circuit including a capacitor array and a switch array, and a resistor DAC (hereinafter, referred to as RDAC) circuit including a resistor string and a switch array. In the C-R hybrid DAC circuit 110, the CDAC circuit may be used to determine upper bits, and the RDAC circuit may be used to determine lower bits together with a unit capacitor of the CDAC circuit.

The C-R hybrid DAC circuit 110 may charge the capacitor array with charges based on the input voltage VIN, then discharge the charges charged in the capacitor array under switch control based on a binary search of the SAR control logic circuit 130 to generate an output voltage, and then output the output voltage to the comparator 120.

The comparator 120 may compare the output voltage of the C-R hybrid DAC circuit 110 supplied to a first input (+) terminal with a common mode voltage supplied to a second input (−) terminal, and output an output bit based on the comparison result to the SAR control logic circuit 130.

The SAR control logic circuit 130 may control a switch operation of the C-R hybrid DAC circuit 110 using the binary search scheme. The SAR control logic circuit 130 may receive the comparison result from the comparator 120, sequentially determine bits from the most significant bit (MSB) to the least significant bit (LSB) and store the bits in a register, and convert the bits into the digital data Dout and output the digital data Dout.

The SAR ADC 100 according to one embodiment operates in a sampling phase and a comparison phase to convert the input voltage VIN into the digital data Dout. The comparison phase may be expressed as a converting phase.

The SAR control logic circuit 130 may control the C-R hybrid DAC circuit 110 and the comparator 120 to operate in the sampling phase and the converting phase.

In the sampling phase, the C-R hybrid DAC circuit 110 may sample the input voltage VIN and store the voltage in the capacitor array.

In the comparison phase, using the comparison result of the comparator 120, which obtained by comparing the output voltage that varies based on the switch operation of the C-R hybrid DAC circuit 110 with the common mode voltage, the SAR control logic circuit 130 may determine the digital data Dout in bit units from the MSB to the LSB.

When switching from the sampling phase to the comparison phase, the SAR control logic circuit 130 according to one embodiment may control a timing sequence of switches that apply the common mode voltage and first and second reference voltages to the capacitor array in the CDAC circuit based on a switch type of a common switch.

The SAR control logic circuit 130 according to one embodiment may control the CDAC circuit such that the switches sequentially switch based on the specific timing sequence from a switch connected to a minimum capacitor of the LSB to a switch connected to a maximum capacitor of the MSB.

The SAR control logic circuit 130 according to one embodiment may control a switching order of the switches differently depending on a channel type of the common switch. The SAR control logic circuit 130 may control the switching order of the switches differently depending on whether the common switch is of a type among a positive metal-oxide-semiconductor (PMOS), a negative MOS (NMOS), and a complementary MOS (CMOS).

Figure 2:
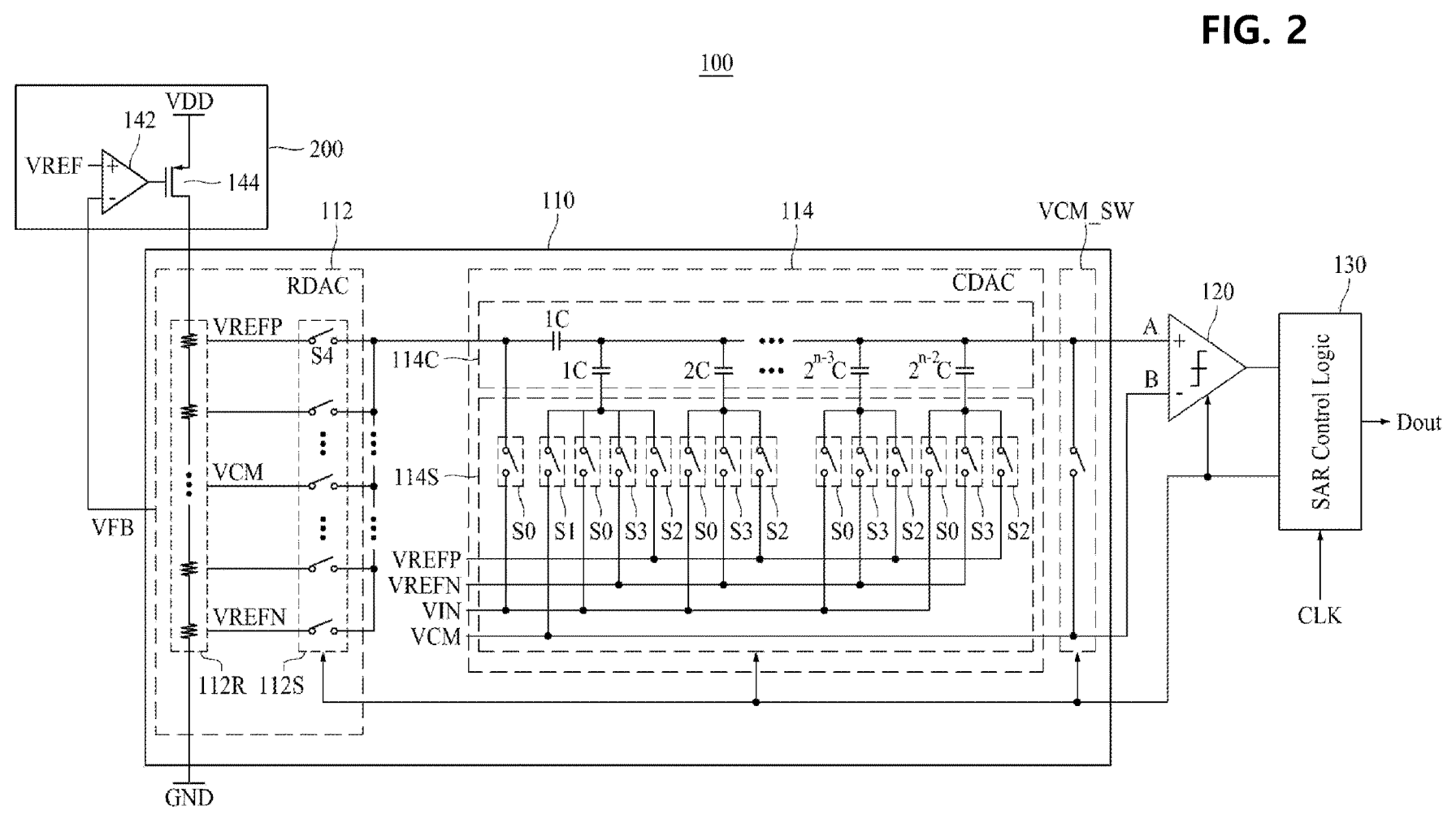
Figure 3:
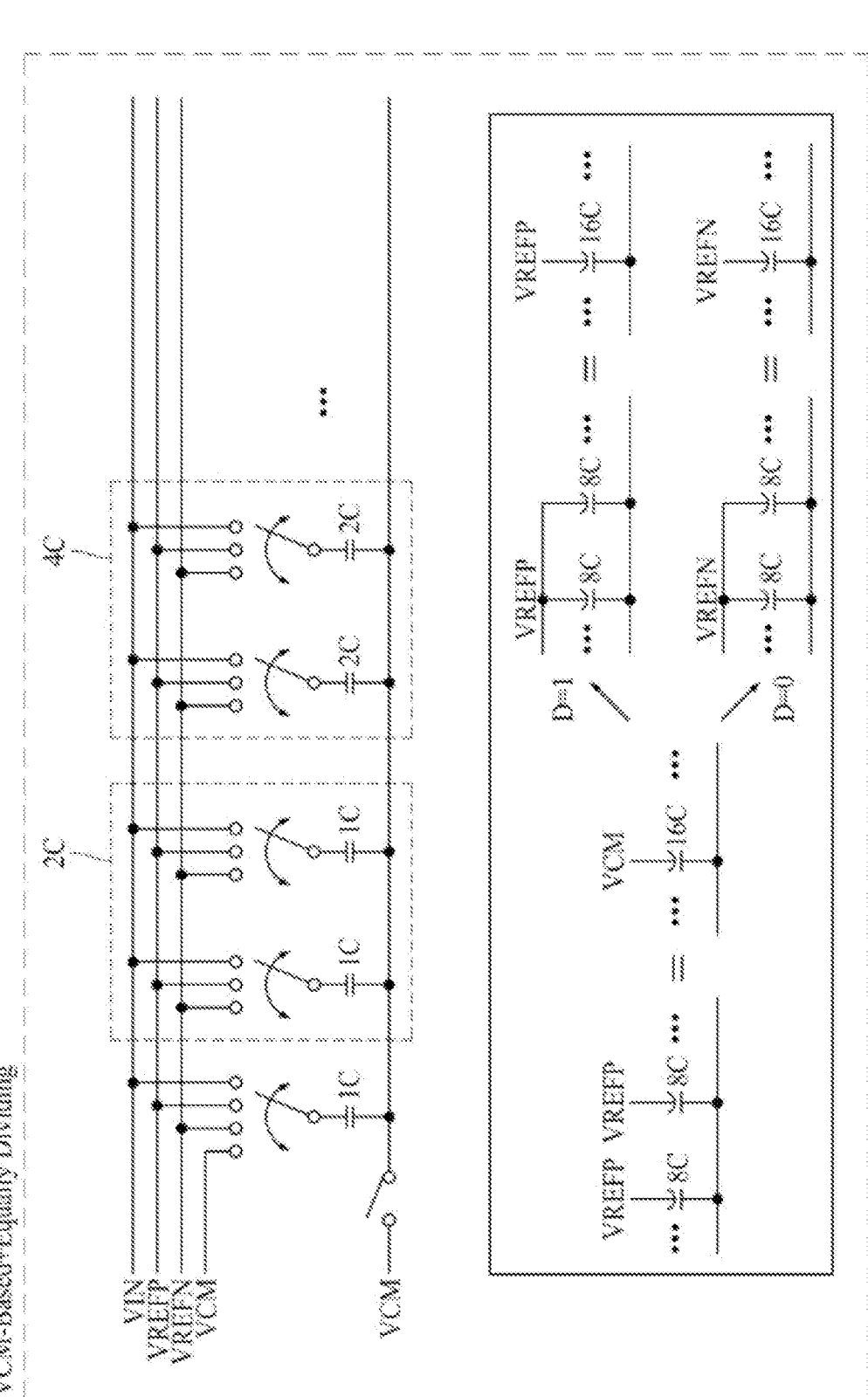
FIG. 3 is a diagram illustrating a capacitor equal division scheme according to an embodiment of the present disclosure.

FIG. 2 is a circuit diagram specifically showing a SAR ADC according to an embodiment of the present disclosure, and FIG. 3 is a diagram illustrating a capacitor equal division scheme according to an embodiment of the present disclosure.

Referring to FIG. 2, the SAR ADC 100 according to one embodiment may include the C-R hybrid DAC circuit 110, the comparator 120, and the SAR control logic circuit 130.

The C-R hybrid DAC circuit 110 according to one embodiment may include a CDAC circuit 114 including a capacitor array 114C used to determine the upper bits, and an RDAC circuit 112 including a resistor string 112R used to determine the lower bits. The CDAC circuit 114 may be used to determine upper n bits (n is an integer equal to or greater than 2), and the RDAC circuit 112 may be used to determine lower m bits (m is an integer equal to or greater than 2).

The RDAC circuit 112 may receive a bias current from a current generator 200 and generate a plurality of reference voltages VREFP to VREFN and a common mode voltage VCM having different voltage levels.

The current generator 200 may include an operational amplifier 142 and an output transistor 144, and may generate the bias current proportional to an input reference voltage VREF and output the bias current to the RDAC circuit 112.

The operational amplifier 142 may receive the input reference voltage VREF from a reference voltage generator at a first input (+) terminal, and receive a feedback voltage VFB supplied from the RDAC circuit 112 at a second input (−) terminal. The operational amplifier 142 may generate a control voltage such that the feedback voltage VFB fed back from the RDAC circuit 112 is maintained equal to the input reference voltage VREF.

The output transistor 144 may generate the bias current, which is a constant current, in response to the control voltage output from the operational amplifier 142 and output the bias current to the RDAC circuit 112.

The RDAC circuit 112 may include the resistor string 112R and a switch array 112S, and the switch array 112S may include a plurality of switches S4 respectively connected to a plurality of voltage dividing nodes of the resistor string 112R.

The resistor string 112R may be composed of a plurality of resistors connected in series with each other between an output line of the current generator 200 and ground GND. The resistor string 112R may generate the first reference voltage VREFP, the second reference voltage VREFN, the common mode voltage VCM, and a plurality of divided reference voltages using the bias current supplied from the current generator 200.

For example, the plurality of divided reference voltages generated in the resistor string 112R may include voltages $VREFP/2^n$ and $VREFN/2^n$ obtained by dividing the first reference voltage VREFP and the second reference voltage VREFN by a ratio of the power of 2 ($2^n$) in a range from the first reference voltage VREFP, which is a positive reference voltage, to the second reference voltage VREFN, which is a negative reference voltage.

The second reference voltage VREFN may be a ground voltage. The first reference voltage VREFP may be a higher voltage than the second reference voltage VREFN. The common mode voltage VCM may be an intermediate voltage between the first reference voltage VREFP and the second reference voltage VREFN.

The switch array 112S may sequentially output the divided reference voltages in response to control of the SAR control logic circuit 130 and apply the output voltages to a unit capacitor 1C of the CDAC circuit 114. The plurality of divided reference voltages sequentially output from the RDAC circuit 112 may be applied to the unit capacitor 1C of the CDAC circuit 114 and used to sequentially determine the lower bits.

The CDAC circuit 114 may include the capacitor array 114C in which capacitors 1C, 2C, . . . , $2^{n-3}C$, and $2^{n-2}C$ whose capacitances have the ratio of the power of 2 are connected in parallel with each other, and a switch array 114S composed of switches S0, S1, S2, and S3 connected to a bottom plate of the capacitor array 114C. A top plate of the capacitor array 114C may be connected to the first input (+) terminal of the comparator 120 via a first node A and may be connected to a common switch VCM_SW that applies the common mode voltage VCM.

Each of the capacitors 1C, 2C, . . . , $2^{n-3}C$, and $2^{n-2}C$ may receive the input voltage VIN via the sampling switch (S0), may receive the first reference voltage VREFP via the switch S2, or may receive the second reference voltage VREFN via the switch S3. One of the two unit capacitors 1C and 1C may receive the common mode voltage VCM via the switch S1.

The capacitors 2C, . . . , $2^{n-3}C$, and $2^{n-2}C$ may have an equally dividing capacitor (EDC) structure.

Referring to FIG. 3, a $16C(=2^4C)$ capacitor to which the common mode voltage VCM is applied may be implemented in a structure in which an $8C(=2^3C)$ capacitor to which the first reference voltage VREFP is applied and an $8C(=2^3C)$ equally dividing capacitor to which the second reference voltage VREFN is applied are connected in parallel with each other. Depending on the comparison result (D=1 or 0) of the comparator 120, the pair of 8C equally dividing capacitors may implement the 16C capacitor to which the first reference voltage VREFP or the second reference voltage VREFN is applied. Similarly, a 2C capacitor may be implemented in a parallel connection structure of a pair of 1C equally dividing capacitors, and a 4C capacitor may be implemented in a parallel connection structure of a pair of 2C equally dividing capacitors.

Likewise, in the CDAC circuit 114, a $2^nC$ capacitor may be implemented as a pair of $2^{n-1}C$ equally dividing capacitors.

The C-R hybrid DAC circuit 110 may allow the switch arrays 112S and 114S to perform the switch operation under the control of the SAR control logic circuit 130 and generate the output voltage at the first node A.

The comparator 120 may repeat the operation of comparing the output voltage of the C-R hybrid DAC circuit 110 generated at the first node A with the common mode voltage VCM applied to a second node B, and output the output bit, which is the comparison result, to the SAR control logic circuit 130.

The SAR control logic circuit 130 may control the operations of the C-R hybrid DAC circuit 110 and the comparator 120 in the sampling phase and the comparison phase.

In the sampling phase, the SAR control logic circuit 130 may turn on the common switch VCM_SW and the sampling switches S0 during a plurality of cycles of a clock signal. Accordingly, as the common mode voltage VCM from the RDAC circuit 112 is applied to the top plate of the capacitor array 114C and the input voltage VIN is applied to the bottom plate, the capacitor array 114C may be charged with the charges based on the input voltage VIN.

When switching from the sampling phase to the comparison phase, the SAR control logic circuit 130 may turn off the sampling switch S0 and the common switch VCM_SW and control the switches S1, S2, S3, and S4 of the C-R hybrid DAC circuit 110. Therefore, the common mode voltage VCM may be applied to the unit capacitor 1C of the capacitor array 114C, and the first and second reference voltages VREFP and VREFN may be equally applied to the equally dividing capacitor structure of the remaining capacitors $2C, \ldots, 2^{n-3}C$, and $2^{n-2}C$.

In particular, the SAR control logic circuit 130 according to one embodiment may not simultaneously operate the switches S1, S2, and S3 that apply the common mode voltage VCM and the first and second reference voltages VREFP and VREFN to the capacitor array 114C of the CDAC circuit 114 when switching from the sampling phase to the comparison phase, and control the switches S1, S2, and S3 to sequentially switch based on the specific timing sequence. Accordingly, a timing error that may occur when the switches S1, S2, and S3 are simultaneously operated or a timing error that may occur by a parasitic capacitance component may be eliminated.

The SAR control logic circuit 130 may switch the switches S1, S2, and S3 based on the specific sequence from the switch S1 of the unit capacitor 1C corresponding to the LSB to the switches S2 and S3 of the capacitor $2^{n-2}C$ corresponding to the MSB. The SAR control logic circuit 130 may switch the switches S1, S2, and S3 based on the specific sequence from the switch S1 of the unit capacitor 1C with the smallest capacitance to the switches S2 and S3 of the maximum capacitor $2^{n-2}C$ with the greatest capacitance. The SAR control logic circuit 130 may sequentially turn on the switches from the switch S1 connected to the unit capacitor 1C to the switches S2 and S3 connected to the capacitor $2^{n-2}C$ with the maximum capacitance in the CDAC circuit 114.

The SAR control logic circuit 130 according to one embodiment may set the switching order of the switches S1, S2, and S3 differently depending on whether the common switch VCM_SW is of the type among the positive metaloxide-semiconductor (PMOS), the negative MOS (NMOS), and the complementary MOS (CMOS).

Accordingly, when switching from the sampling phase to the comparison phase, the switching timing error of the switches S1, S2, and S3 may be eliminated to minimize or prevent the charges charged in the capacitor array 114C from being lost via the common switch VCM_SW that is turned off.

In the comparison phase, the SAR control logic circuit 130 may turn off the sampling switch S0 and the common switch VCM_SW, control the switch operations of the switches S1, S2, S3, and S4 of the C-R hybrid DAC circuit 110 based on the binary search scheme for each cycle of the clock signal, and control the comparison operation of the comparator 120. Depending on the result of comparing, by the comparator 120, the output voltage of the C-R hybrid DAC circuit 110 with the common mode voltage VCM, the SAR control logic circuit 130 may sequentially determine the bits from the MSB to the LSB and store the bits in the register. The SAR control logic circuit 130 may output the digital data Dout stored in the register when the comparison phase ends.

The SAR ADC according to one embodiment of the present disclosure may minimize or prevent the charge loss of the capacitor array 114C when switching from the sampling phase to the comparison phase, thereby preventing a decision error of a digital code resulted from the charge loss and outputting the accurate digital data Dout.

Figure 4:
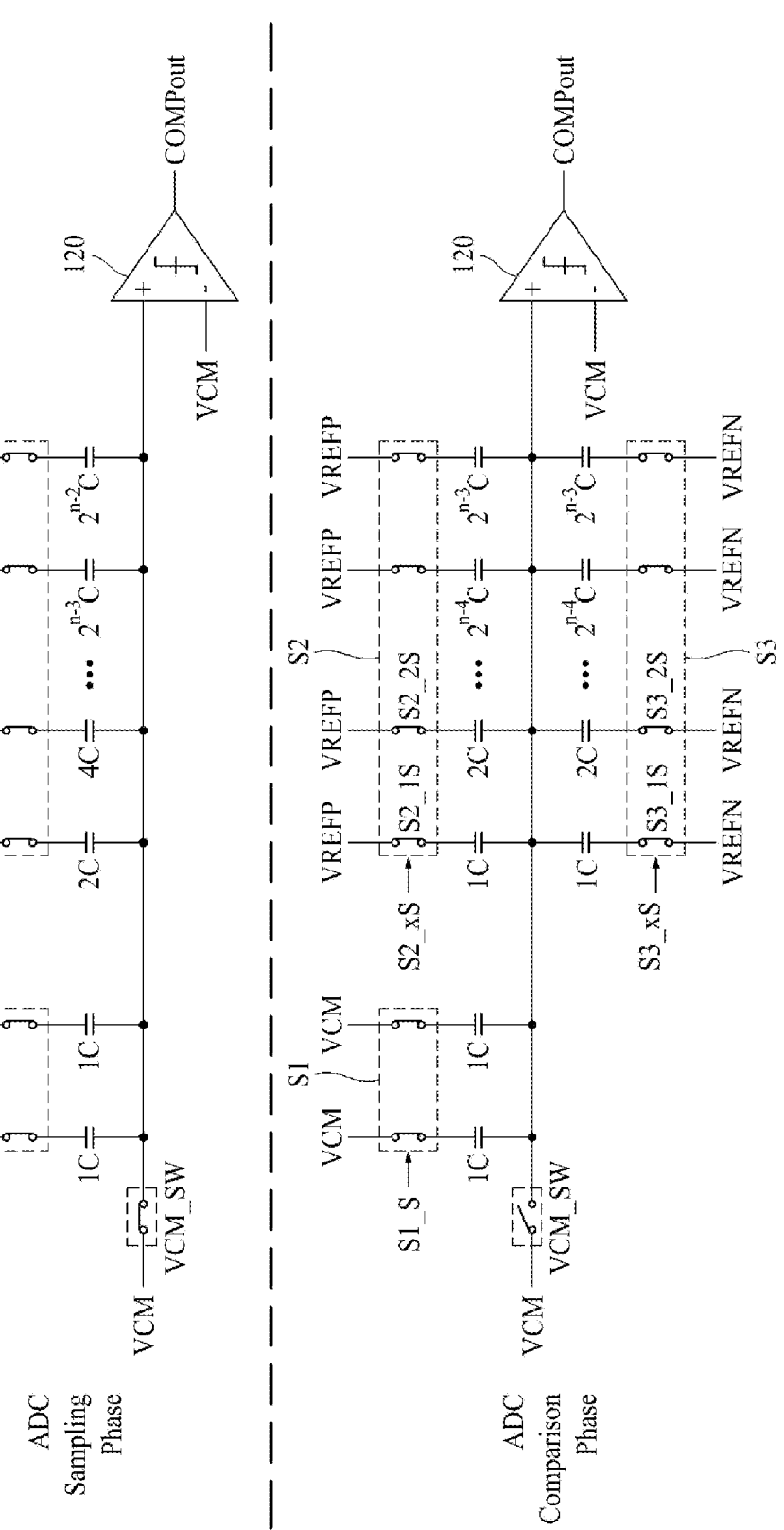
FIG. 4 is an equivalent circuit diagram showing a switch operation of a CDAC circuit according to an embodiment of the present disclosure.
Figure 5:
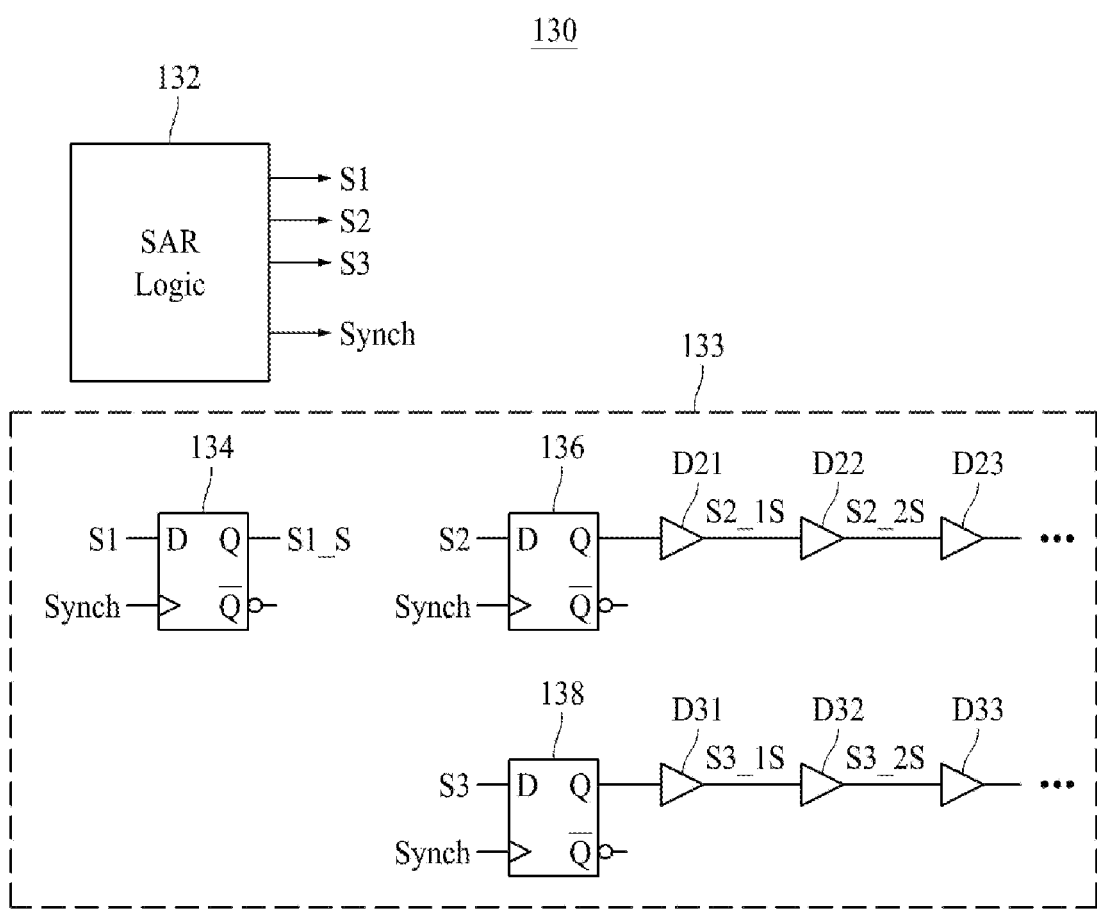
FIG. 5 is a diagram showing a configuration of a control signal generator of a SAR control logic circuit according to an embodiment of the present disclosure.
Figure 6:
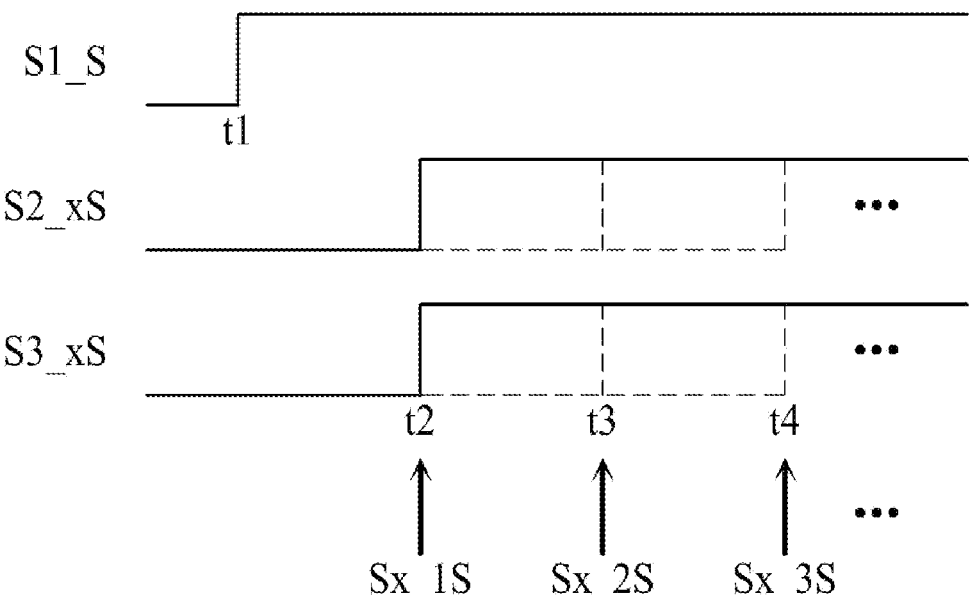
FIG. 6 is a timing diagram of control signals according to an embodiment of the present disclosure.
Figure 7:
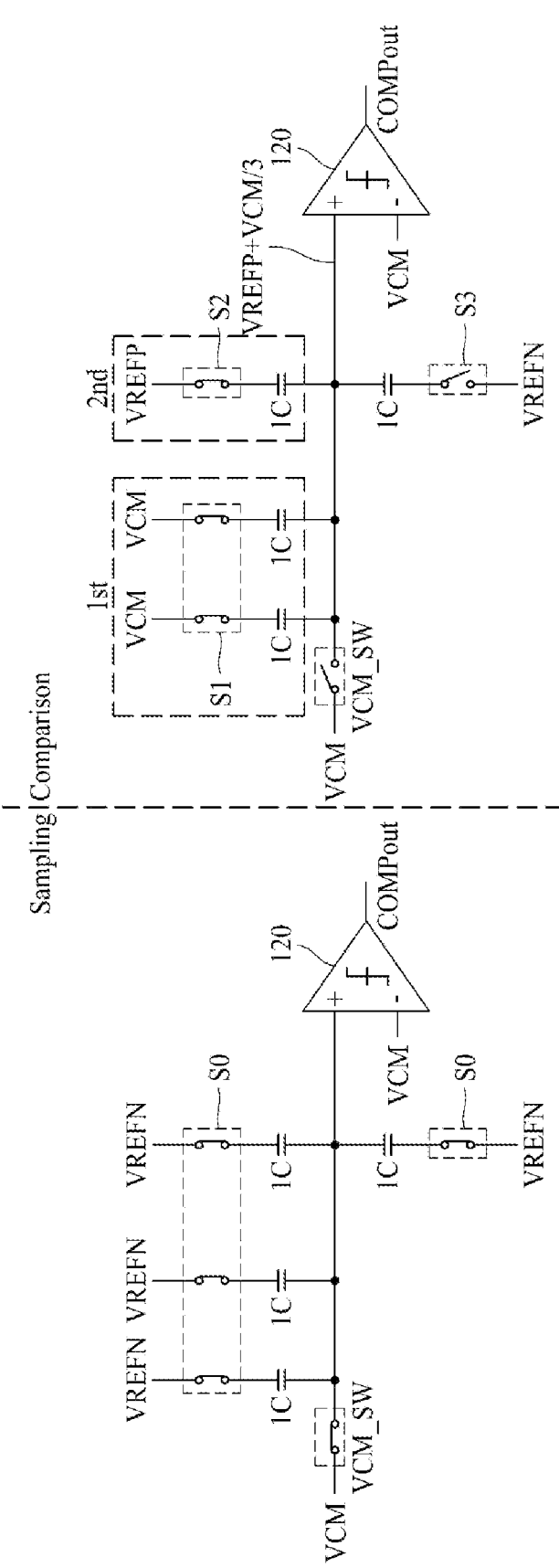
FIGS. 7 and 8 are diagrams illustrating a state of a CDAC top plate when switching to a comparison phase in a case of a CMOS common switch and a low input voltage in an embodiment of the present disclosure.
Figure 8:
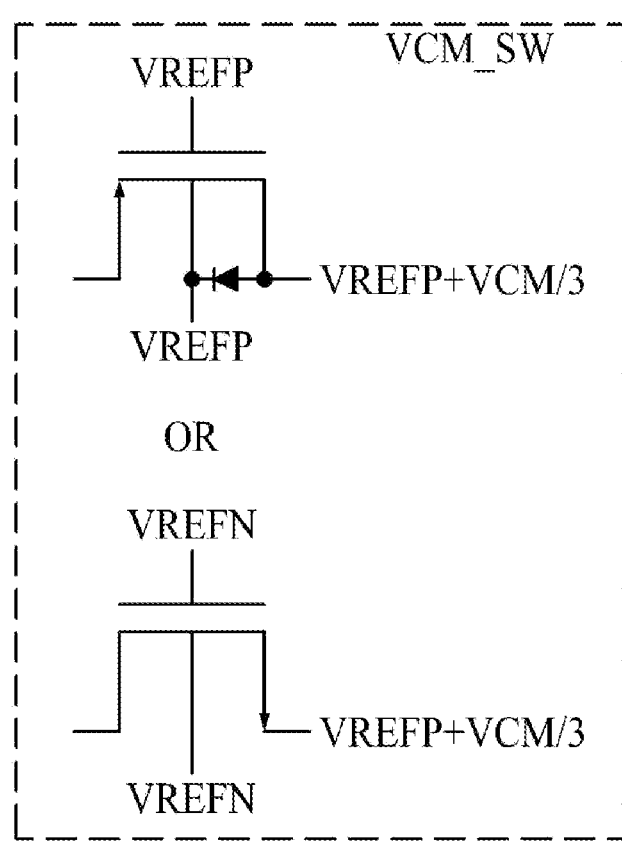
Figure 9:
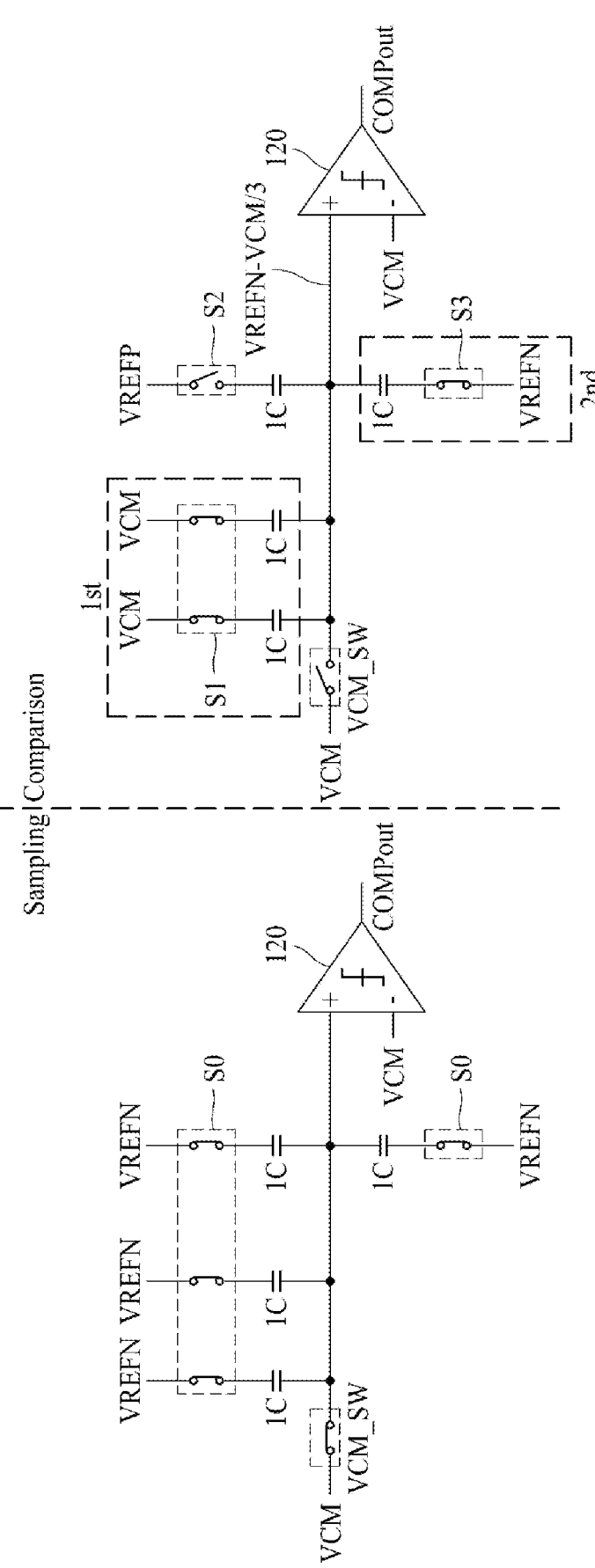
FIGS. 9 and 10 are diagrams illustrating a state of a CDAC top plate when switching to a comparison phase in a case of a CMOS common switch and a high input voltage in an embodiment of the present disclosure.
Figure 10:
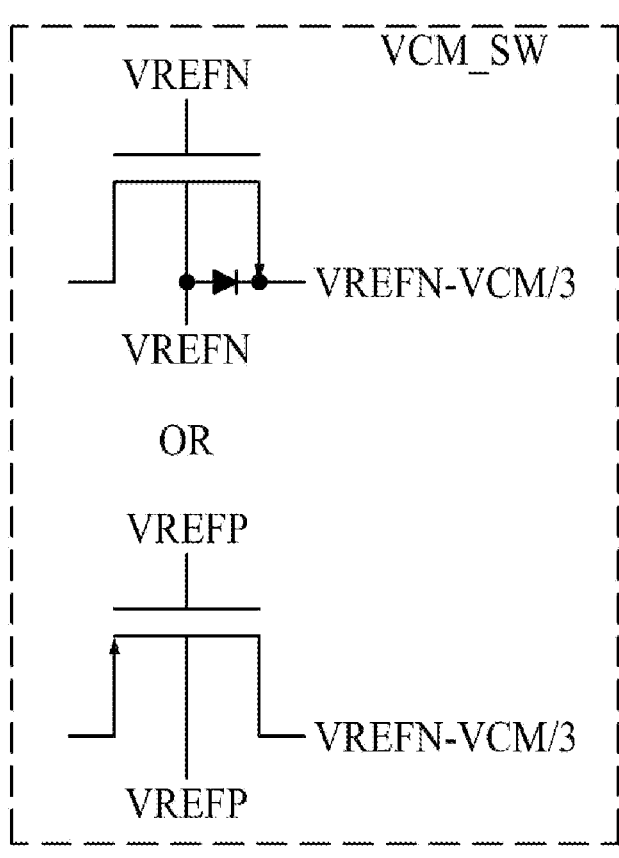

FIG. 4 is an equivalent circuit diagram showing a switch operation of a CDAC circuit according to an embodiment of the present disclosure, FIG. 5 is a diagram showing a configuration of a control signal generator of a SAR control logic circuit according to an embodiment of the present disclosure, and FIG. 6 is a timing diagram of control signals according to an embodiment of the present disclosure. FIGS. 7 and 8 are diagrams illustrating a state of a CDAC top plate when switching to a comparison phase in a case of a CMOS common switch and a low input voltage in an embodiment of the present disclosure, and FIGS. 9 and 10 are diagrams illustrating a state of a CDAC top plate when switching to a comparison phase in a case of a CMOS common switch and a high input voltage in an embodiment of the present disclosure.

Referring to FIGS. 4 to 6, in response to the control of the SAR control logic circuit 130, the switches S0, S1, S3, and VCM_SM of the CDAC circuit may perform the switch operations in the sampling phase and the comparison phase.

In the sampling phase, the sampling switch S0 and the common switch VCM_SW may be turned on, so that each of the capacitors $1C, 2C, \ldots, 2^{n-3}C$, and $2^{n-2}C$ may be charged with the charges based on the input voltage VIN.

The common switch VCM_SW according to one embodiment may use a CMOS switch.

When switching from the sampling phase to the comparison phase, the sampling switch S0 and the common switch VCM_SW may be turned off, and the first switches S1 that apply the common mode voltage VCM to unit capacitors 1C, the second switches S2 that apply the first reference voltage VREFP to a half of the equally dividing capacitors $2\times1C$, $2\times2C, \ldots, 2\times2^{n-4}C$, and $2\times2^{n-3}C$, and the third switches S3 that apply the second reference voltage VREFN to the other half may be sequentially turned on based on the specific timing sequence in response to first-first, second-xth (x is a natural number), and third-xth control signals S1_S, S2_xS, and S3_xS.

The first switches S1 may be first turned on in response to the first-first control signal S1_S, and then the second and third switches S2 and S3 may be sequentially turned on in response to the second-xth and third-xth control signals S2_xS and S3_xS in an ascending order of the capacitance.

The SAR control logic circuit 130 according to one embodiment may include a SAR logic circuit 132 and a control signal generator 133.

The SAR logic circuit 132 may generate and output first to third control signals S1, S2, and S3 and a synchronization signal Synch.

The control signal generator 133 may receive the first to third control signals S1, S2, and S3 and the synchronization signal Synch from the SAR logic circuit 132 and generate and output the first-first, second-xth, and third-xth switching control signals S1_S, S2_xS, and S3_xS.

A first D-flip-flop 134 of the control signal generator 133 may output the first-first switching control signal S1_S corresponding to the first control signal S1 in response to the synchronization signal Synch.

A second D-flip-flop 136 of the control signal generator 133 may output the second control signal S2 in response to the synchronization signal Synch, and may sequentially output second-first, second-second, second-third, . . . switching control signals S2_1S, S2_2S, S2_3S, . . . via a plurality of serially connected delays D21, D22, D23, . . . , respectively.

A second D-flip-flop 138 of the control signal generator 133 may output the third control signal S3 in response to the synchronization signal Synch, and may sequentially output third-first, third-second, third-third, . . . switching control signals S3_1S, S3_2S, S3_3S, . . . via a plurality of serially connected delays D31, D32, D33, . . . , respectively.

The control signal generator 133 may output the first-first switching control signal S1_S of a turn-on level at a first timing t1.

The control signal generator 133 may output the second-first switching control signal S2_1S and the third-first switching control signal S3_1S of the turn-on level at a second timing t2. The control signal generator 133 may simultaneously output the second-first switching control signal S2_1S and the third-first switching control signal S3_1S or output the signals at different timings.

The control signal generator 133 may output the second-second switching control signal S2_2S and the third-second switching control signal S3_2S of the turn-on level at a third timing t3. The control signal generator 133 may simultaneously output the second-second switching control signal S2_2S and the third-second switching control signal S3_2S or output the signals at different timings.

At the first timing t1, the first switches S1 that apply the common mode voltage VCM to the unit capacitors 1C may be turned on.

At the second timing t2, the second switch (second-first switch) S2 that applies the first reference voltage VREFP to the one 1C equally dividing capacitor may be turned on by the second-first switching control signal S2_1S, and the third switch (third-first switch) S3 that applies the second reference voltage VREFN to the other 1C equally dividing capacitor may be turned on by the third-first switching control signal S3_1S.

At the third timing t3, the second switch (second-second switch) S2 that applies the first reference voltage VREFP to the one 2C equally dividing capacitor may be turned on by the second-second switching control signal S2_2S, and the third switch (third-second switch) S3 that applies the second reference voltage VREFN to the other 2C equally dividing capacitor may be turned on by the third-second switching control signal S3_2S.

In such order, the second switch S2 that applies the first reference voltage VREFP and the third switch S3 that applies the second reference voltage VREFN to the pair of $2^{n-4}C$ equally dividing capacitors may be turned on, and then the second switch S2 that applies the first reference voltage VREFP and the third switch S3 that applies the second reference voltage VREFN to the pair of $2^{n-3}C$ equally dividing capacitors may be turned on.

In the SAR control logic circuit 130 according to one embodiment, the common switch is the CMOS switch, and when switching from the sampling phase to the comparison phase, the first switches S1 that apply the common mode voltage VCM to the unit capacitors 1C may be turned on at the first timing, and a second-Nth switch that applies the first reference voltage VREFP to one of a pair of Nth equally dividing capacitors and a third-Nth switch that applies the second reference voltage VREFN to the other may be turned on at a N+1th timing.

Referring to FIGS. 7 to 10, the common switch VCM_SW may use the CMOS switch including both a PMOS switch and an NMOS switch.

Referring to FIGS. 7 and 8, in the sampling phase, the common switch VCM_SW may be turned on and the sampling switch S0 may be turned on to sample the lowest voltage applied to the input voltage VIN, for example, the second reference voltage VREFN, and store the sampled voltage in the capacitor array.

When switching from the sampling phase to the comparison phase, the common switch VCM_SW and the sampling switch S0 may be turned off, and the first switch S1 may be turned on at the first timing t1, so that the common mode voltage VCM may be applied to the unit capacitors 1C.

At the second timing t2, at least one of the second-first switch S2 and the third-first switch S3 may be turned on, so that the first and second reference voltages VREFP and VREFN may be applied to the pair of 1C equally dividing capacitors. When the second-first switch S2 is turned on first at the second timing t2, a "VREFP+VCM/3" voltage may be generated at the top plate of the CDAC circuit connected to the first input (+) terminal of the comparator 120.

The common switch VCM_SW that is turned off may stably maintain the turn-off state as a drain potential of the PMOS switch whose gate is applied with the VREFP as a turn-off voltage becomes the "VREFP+VCM/3" and a source potential of the NMOS switch whose gate is applied with the VREFN as the turn-off voltage becomes the "VREFP+VCM/3".

Accordingly, the charges stored in the capacitor array of the CDAC based on the input voltage (VIN=VREFN) that is low in the sampling phase may be minimized or prevented from being lost via the CMOS common switch VCM_SW that is turned off when switching to the comparison phase.

Referring to FIGS. 9 and 10, in the sampling phase, the common switch VCM_SW may be turned on and the sampling switch S0 may be turned on to sample the highest voltage applied to the input voltage VIN, for example, the first reference voltage VREFP, and store the sampled voltage in the capacitor array.

When switching from the sampling phase to the comparison phase, the common switch VCM_SW and the sampling switch S0 may be turned off, and the first switch S1 may be turned on at the first timing t1, so that the common mode voltage VCM may be applied to the unit capacitors 1C.

At the second timing t2, at least one of the second-first switch S2 and the third-first switch S3 may be turned on and the first and second reference voltages VREFP and VREFN may be applied to the pair of 1C equally dividing capacitors.

When the third-first switch S3 is turned on first at the second timing t2, the "VREFN-VCM/3" voltage may be generated at the top plate of the CDAC circuit connected to the first input (+) terminal of the comparator 120.

The common switch VCM_SW that is turned off may stably maintain the turn-off state as the drain potential of the PMOS switch whose gate is applied with the VREFP as the turn-off voltage becomes the "VREFN-VCM/3" and the source potential of the NMOS switch whose gate is applied with the VREFN as the turn-off voltage becomes the "VREFN-VCM/3".

Accordingly, the charges stored in the capacitor array of the CDAC based on the input voltage (VIN=VREFP) that is high in the sampling phase may be minimized or prevented from being lost via the CMOS common switch VCM_SW that is turned off when switching to the comparison phase.

For example, when a VCM/3 voltage is lower than a turn-on voltage of an internal diode of the PMOS switch or when a PMOS body voltage is higher than the "VREFP+VCM/3" voltage and an NMOS body voltage is lower than the "VREFP+VCM/3" voltage, the CMOS common switch VCM_SW may maintain the stable turn-off state when switching to the comparison phase, so that the charges charged to the capacitor array may be minimized or prevented from being lost via the CMOS common switch VCM_SW.

Figure 11:
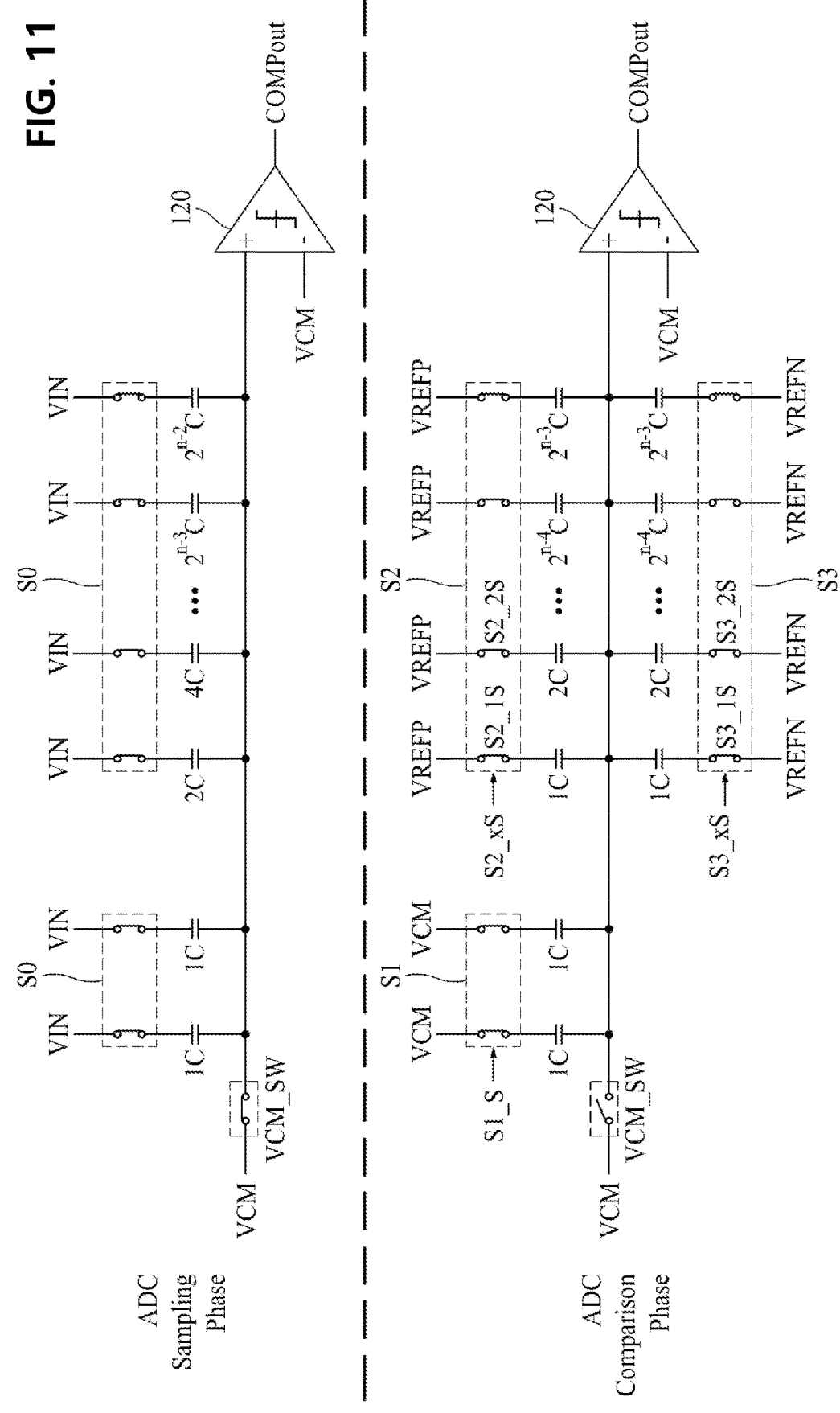
FIG. 11 is an equivalent circuit diagram showing a switch operation of a CDAC circuit according to an embodiment of the present disclosure.
Figure 12:
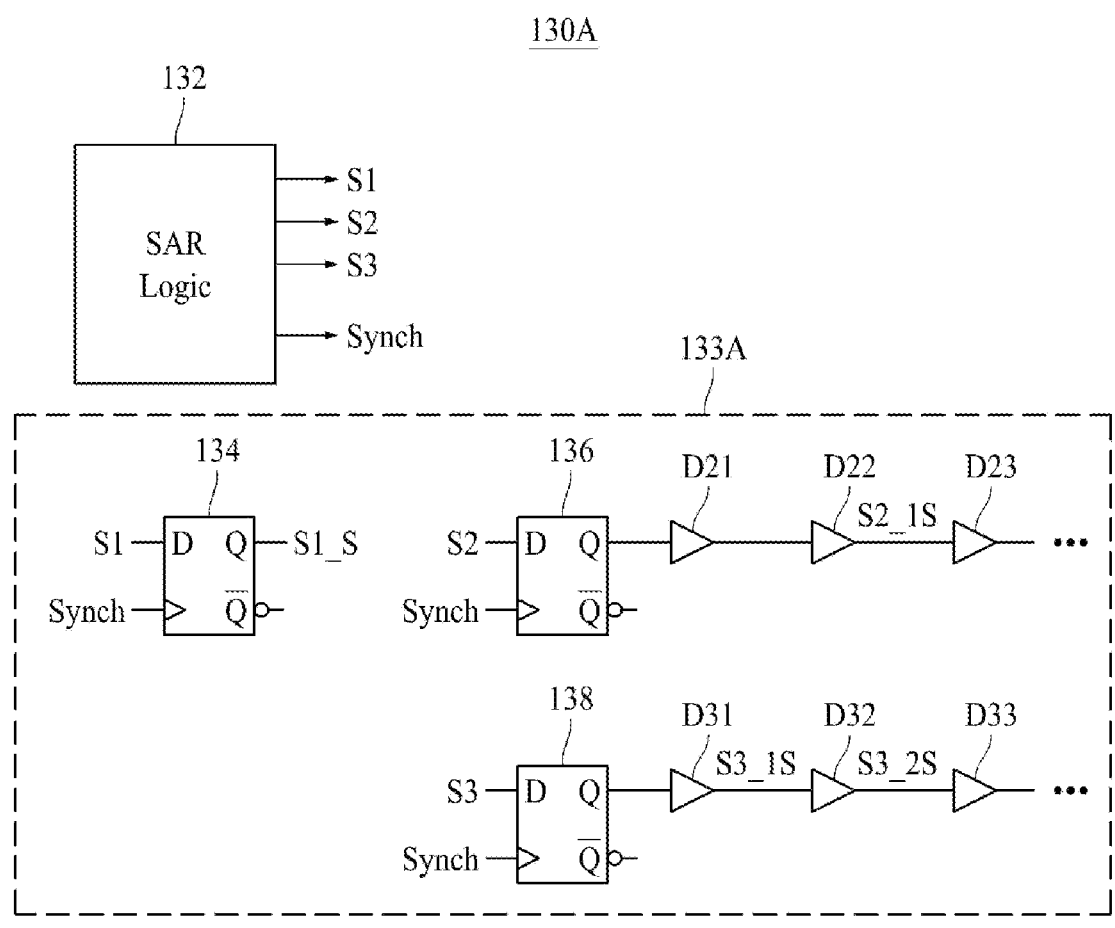
FIG. 12 is a diagram showing a configuration of a control signal generator of a SAR control logic circuit according to an embodiment of the present disclosure.
Figure 13:
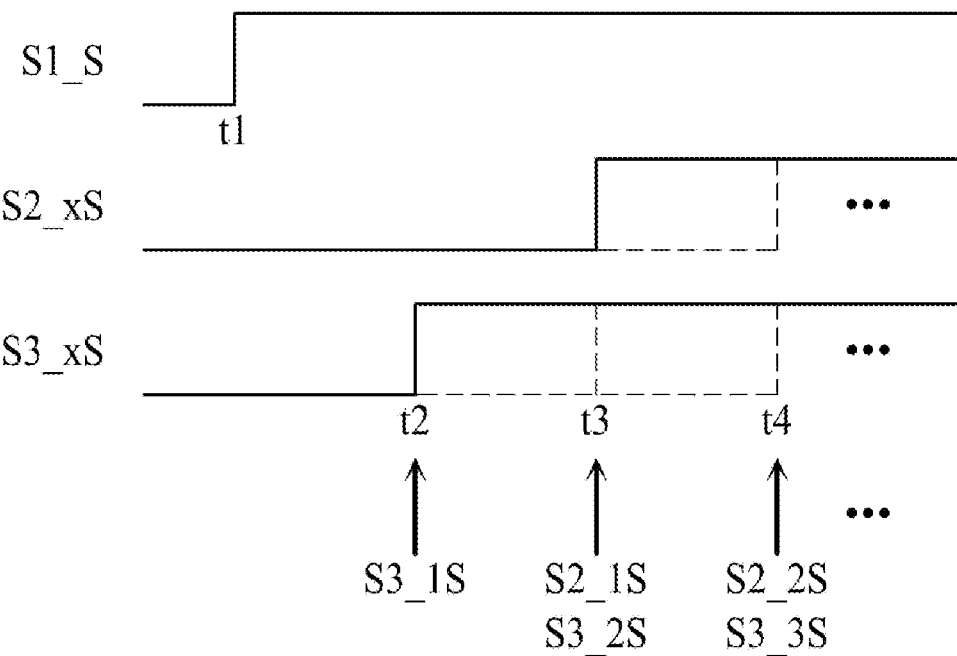
FIG. 13 is a timing diagram of control signals according to an embodiment of the present disclosure.
Figure 14:
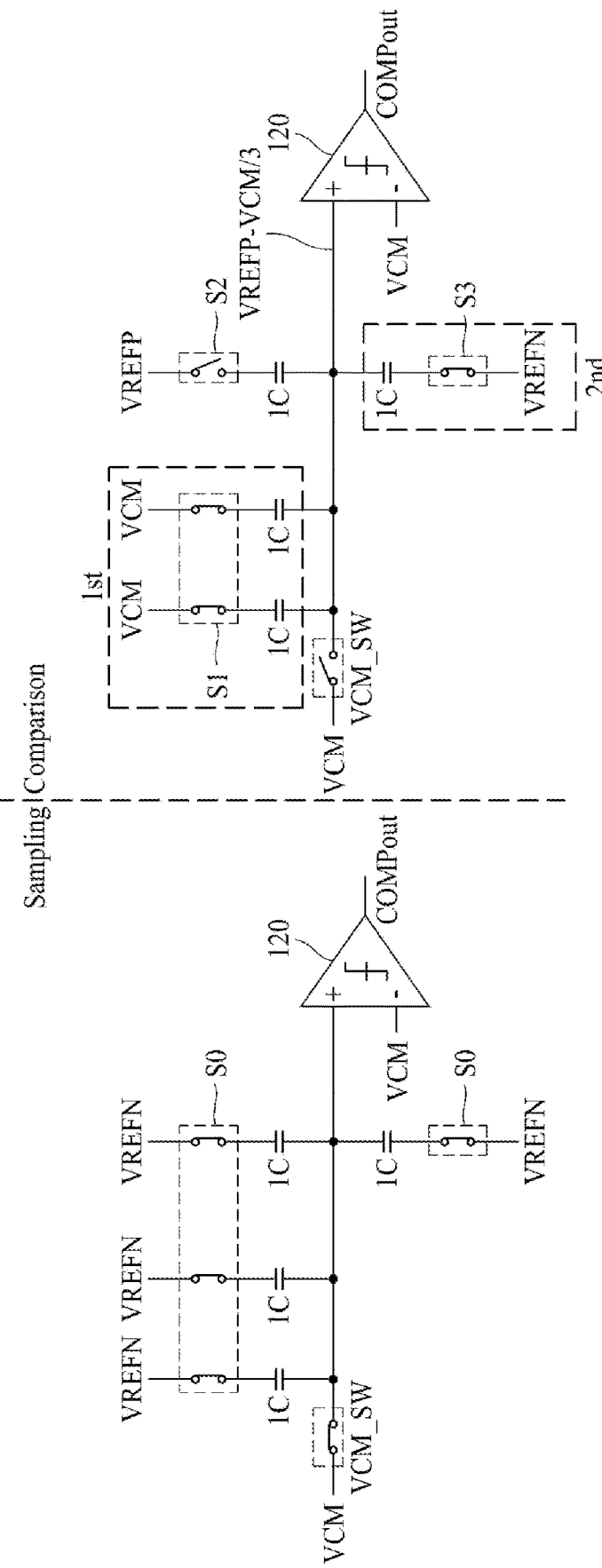
FIGS. 14 and 15 are diagrams illustrating a state of a CDAC top plate when switching to a comparison phase in a case of a PMOS common switch and a low input voltage in an embodiment of the present disclosure.
Figure 15:
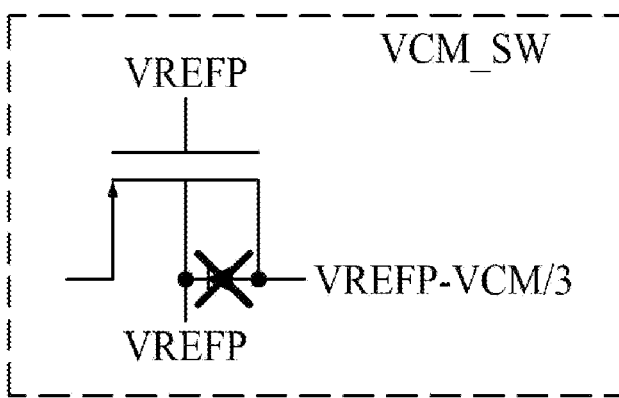
Figure 16:
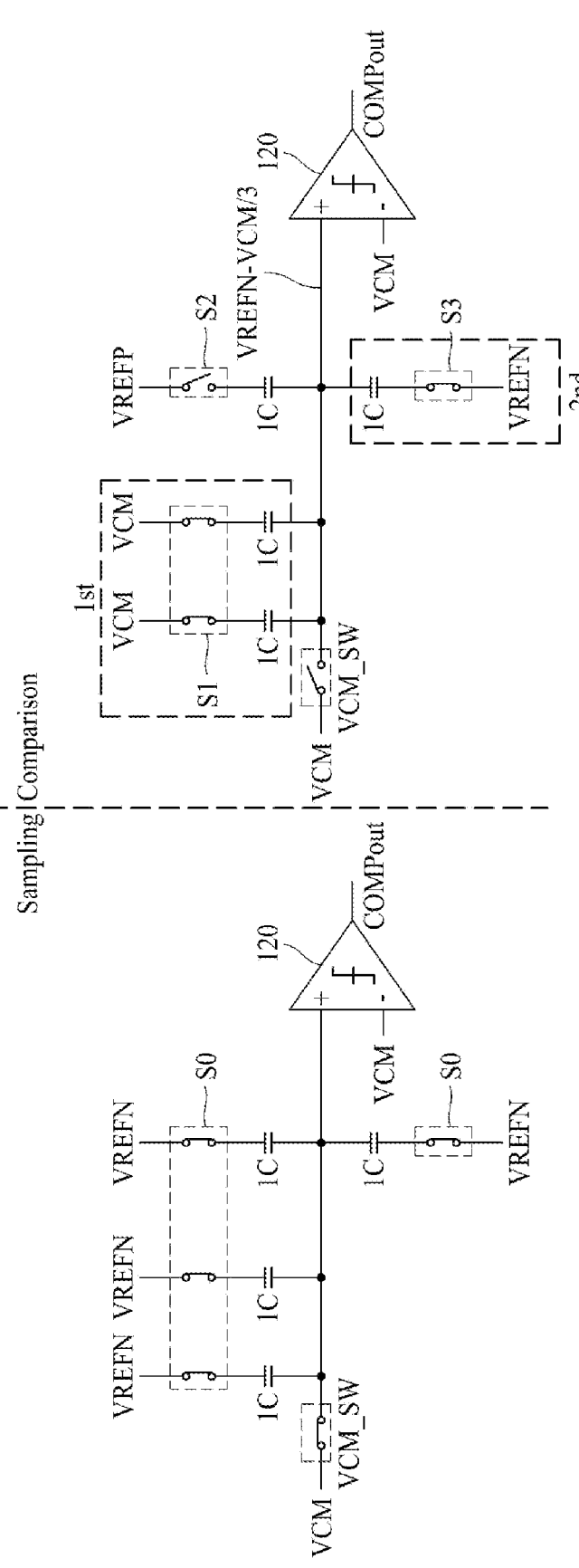
FIGS. 16 and 17 are diagrams illustrating a state of a CDAC top plate when switching to a comparison phase in a case of a PMOS common switch and a high input voltage in an embodiment of the present disclosure.
Figure 17:
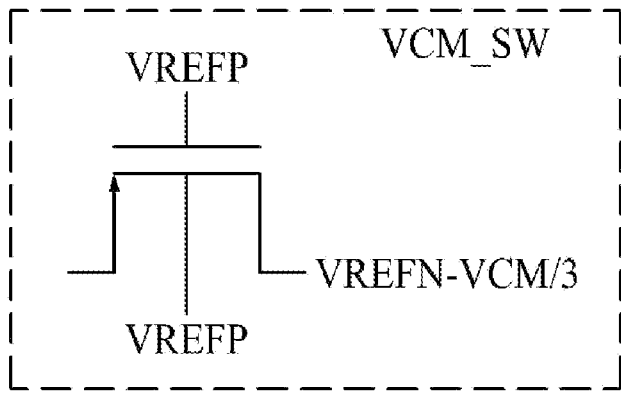

FIG. 11 is an equivalent circuit diagram showing a switch operation of a CDAC circuit according to an embodiment of the present disclosure, FIG. 12 is a diagram showing a configuration of a control signal generator of a SAR control logic circuit according to an embodiment of the present disclosure, and FIG. 13 is a timing diagram of control signals according to an embodiment of the present disclosure. FIGS. 14 and 15 are diagrams illustrating a state of a CDAC top plate when switching to a comparison phase in a case of a PMOS common switch and a low input voltage in an embodiment of the present disclosure, and FIGS. 16 and 17 are diagrams illustrating a state of a CDAC top plate when switching to a comparison phase in a case of a PMOS common switch and a high input voltage in an embodiment of the present disclosure.

Referring to FIGS. 11 to 17, the switches S0, S1, S3, and VCM_SM of the CDAC circuit may perform the switch operations in the sampling phase and the comparison phase in response to control of a SAR control logic circuit 130A.

In the sampling phase, the sampling switch S0 and the common switch VCM_SW may be turned on, so that each of the capacitors 1C, 2C, . . . , $2^{n-3}$C, and $2^{n-2}$C may be charged with the charges based on the input voltage VIN.

The common switch VCM_SW according to one embodiment may use the PMOS switch.

When switching from the sampling phase to the comparison phase, the sampling switch S0 and the common switch VCM_SW may be turned off, and the first switches S1 that apply the common mode voltage VCM to the unit capacitors 1C, the second switches S2 that apply the first reference voltage VREFP to the half of the equally dividing capacitors $2 \times 1$C, $2 \times 2$C, . . . , $2 \times 2^{n-4}$C, and $2 \times 2^{n-3}$C, and the third switches S3 that apply the second reference voltage VREFN to the other half may be sequentially turned on based on the specific timing sequence in response to the first-first, second-xth (x is the natural number), and third-xth control signals S1_S, S2_xS, and S3_xS.

The first switches S1 may be first turned on in response to the first-first control signal S1_S, and then the second and third switches S2 and S3 may be sequentially turned on in response to the second-xth and third-xth control signals S2_xS and S3_xS in the ascending order of the capacitance.

The SAR control logic circuit 130A according to one embodiment may include the SAR logic circuit 132 and a control signal generator 133A.

The SAR logic circuit 132 may generate and output the first to third control signals S1, S2, and S3 and the synchronization signal Synch.

The control signal generator 133A may receive the first to third control signals S1, S2, and S3 and the synchronization signal Synch from the SAR logic circuit 132, and generate and output the first-first, second-xth, and third-xth switching control signals S1_S, S2_xS, and S3_xS.

The first D-flip-flop 134 of the control signal generator 133A may output the first-first switching control signal S1_S corresponding to the first control signal S1 in response to the synchronization signal Synch.

The second D-flip-flop 136 of the control signal generator 133A may output the second control signal S2 in response to the synchronization signal Synch, and may sequentially output the second-first, second-second, second-third, . . . switching control signals S2_1S, S2_2S, S2_3S, . . . via remaining delays D22, D23, . . . excluding the first delay D21 among the plurality of serially connected delays D21, D22, D23, . . . , respectively.

The second D-flip-flop 138 of the control signal generator 133A may output the third control signal S3 in response to the synchronization signal Synch, and may sequentially output the third-first, third-second, third-third, . . . switching control signals S3_1S, S3_2S, S3_3S, . . . via the plurality of serially connected delays D31, D32, D33, . . . , respectively.

The control signal generator 133A may output the first-first switching control signal S1_S of the turn-on level at the first timing t1.

The control signal generator 133A may output the third-first switching control signal S3_1S of the turn-on level at the second timing t2.

The control signal generator 133A may output the second-first switching control signal S2_1S and the third-second switching control signal S3_2S of the turn-on level at the third timing t3. The control signal generator 133 may simultaneously output the second-first switching control signal S2_1S and the third-second switching control signal S3_2S, or output the signals at the different timings.

At the first timing t1, the first switches S1 that apply the common mode voltage VCM to the unit capacitors 1C may be turned on.

At the second timing t2, the third switch (third-first switch) S3 that applies the second reference voltage VREFN to the one 1C equally dividing capacitor may be turned on by the third-first switching control signal S3_1S.

At the third timing t3, the second switch (second-first switch) S2 that applies the first reference voltage VREFP to the remaining 1C equally dividing capacitor may be turned on by the second-first switching control signal S2_1S, and the third switch (third-second switch) S3 that applies the second reference voltage VREFN to the one 2C equally dividing capacitor may be turned on by the third-second switching control signal S3_2S.

In such order, the third switch S3 that applies the second reference voltage VREFN to one of the pair of $2^{n-4}$C equally dividing capacitors and the second switch S2 that applies the first reference voltage VREFP to one of the pair of $2^{n-3}$C equally dividing capacitors may be turned on, and then the third switch S3 that applies the second reference voltage VREFN to one of the pair of $2^{n-3}C$ equally dividing capacitors may be turned on.

In the SAR control logic circuit 130A according to one embodiment, the common switch VCM_SW is the PMOS switch, and when switching from the sampling phase to the comparison phase, the first switches S1 that apply the common mode voltage VCM to the unit capacitors 1C may be turned on at the first timing, the third_first switch that applies the second reference voltage VREFP to one of the pair of first equally dividing capacitors may be turned on at the second timing, and a second_(N−2)th switch that applies the first reference voltage to one of a pair of Nth-second equally dividing capacitors and a third_(N−1)th switch that applies the second reference voltage VREFN to one of a pair of Nth-first equally dividing capacitors may be turned on at a Nth (N is an integer greater than 2) timing.

Referring to FIGS. 14 to 17, the common switch VCM_SW may use the PMOS switch.

Referring to FIGS. 14 and 15, in the sampling phase, the common switch VCM_SW may be turned on and the sampling switch S0 may be turned on to sample the lowest voltage applied to the input voltage VIN, for example, the second reference voltage VREFN, and store the sampled voltage in the capacitor array.

When switching from the sampling phase to the comparison phase, the common switch VCM_SW and the sampling switch S0 may be turned off, and the first switch S1 may be turned on at the first timing t1, so that the common mode voltage VCM may be applied to the unit capacitors 1C.

At the second timing t2, the third-first switch S3 may be turned on, so that the second reference voltage VREFN may be applied first to one of the pair of 1C equally dividing capacitors. In this case, the "VREFP-VCM/3" voltage may be generated at the top plate of the CDAC circuit connected to the first input (+) terminal of the comparator 120.

Because the VREFP is applied as the turn-off voltage to the gate and the drain potential becomes the "VREFP-VCM/3", the PMOS common switch VCM_SW may stably maintain the turn-off state and the internal diode may also maintain the turn-off state.

Accordingly, the charges stored in the capacitor array of the CDAC based on the input voltage (VIN=VREFN) that is low in the sampling phase may be minimized or prevented from being lost via the PMOS common switch VCM_SW that is turned off when switching to the comparison phase.

Referring to FIGS. 16 and 17, in the sampling phase, the common switch VCM_SW may be turned on and the sampling switch S0 may be turned on to sample the highest voltage applied to the input voltage VIN, for example, the first reference voltage VREFP, and store the sampled voltage in the capacitor array.

When switching from the sampling phase to the comparison phase, the common switch VCM_SW and the sampling switch S0 may be turned off, and the first switch S1 may be turned on at the first timing t1, so that the common mode voltage VCM may be applied to the unit capacitors 1C.

At the second timing t2, the third-first switch S3 may be turned on, so that the second reference voltage VREFN may be applied first to one of the pair of 1C equally dividing capacitors. In this case, the "VREFN-VCM/3" voltage may be generated at the top plate of the CDAC circuit connected to the first input (+) terminal of the comparator 120.

Because the VREFP is applied as the turn-off voltage to the gate and the drain potential becomes the "VREFN- VCM/3", the PMOS common switch VCM_SW may stably maintain the turn-off state and the internal diode may also maintain the turn-off state.

Accordingly, the charges stored in the capacitor array of the CDAC based on the input voltage (VIN=VREFP) that is high in the sampling phase may be minimized or prevented from being lost via the PMOS common switch VCM_SW that is turned off when switching to the comparison phase.

Figure 18:
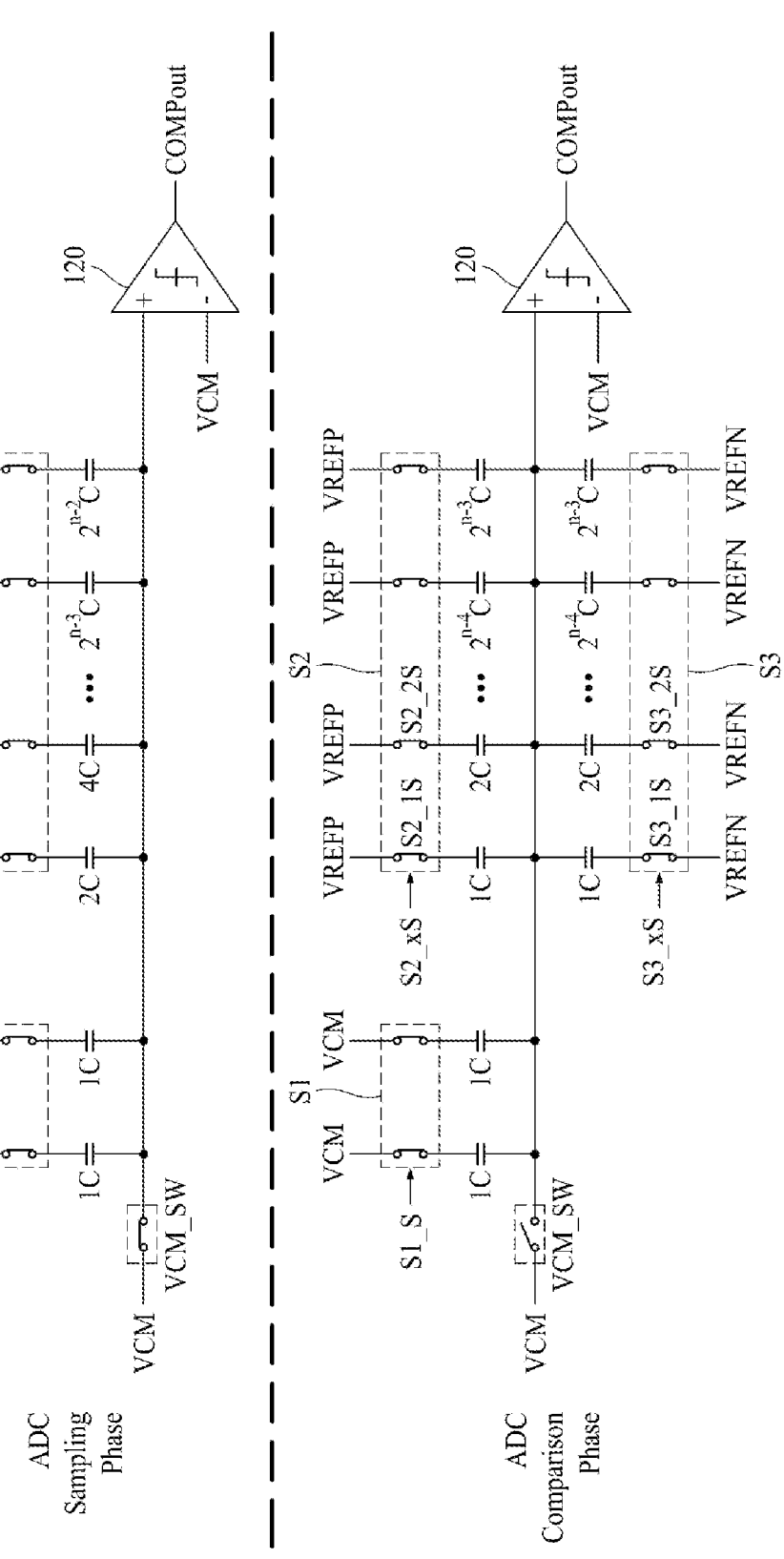
FIG. 18 is an equivalent circuit diagram showing a switch operation of a CDAC circuit according to an embodiment of the present disclosure.
Figure 19:
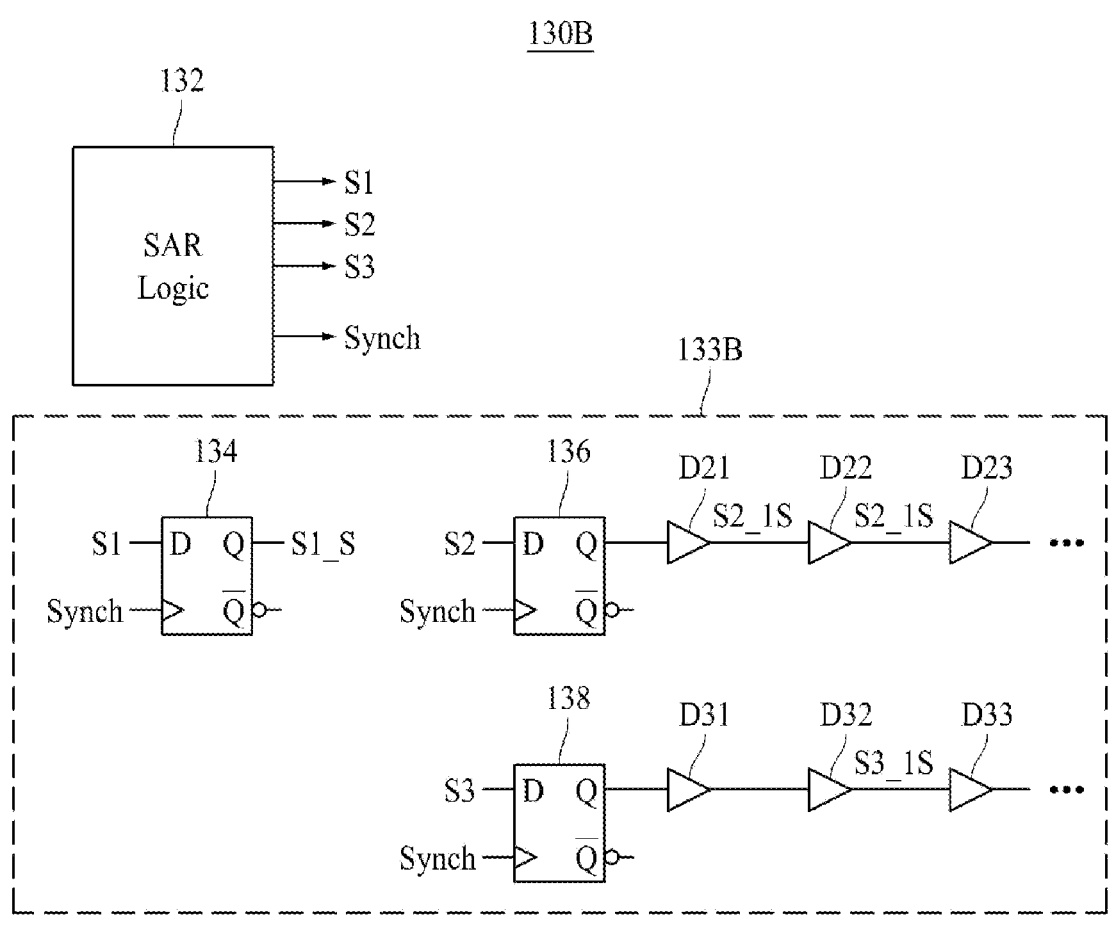
FIG. 19 is a diagram showing a configuration of a control signal generator of a SAR control logic circuit according to an embodiment of the present disclosure.
Figure 20:
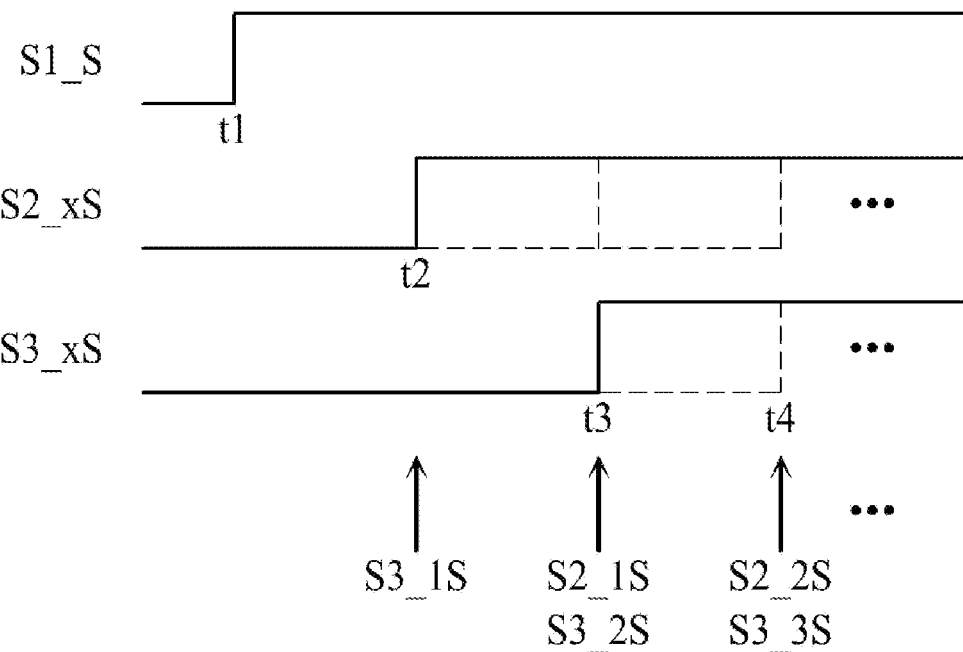
FIG. 20 is a timing diagram of control signals according to an embodiment of the present disclosure.
Figure 21:
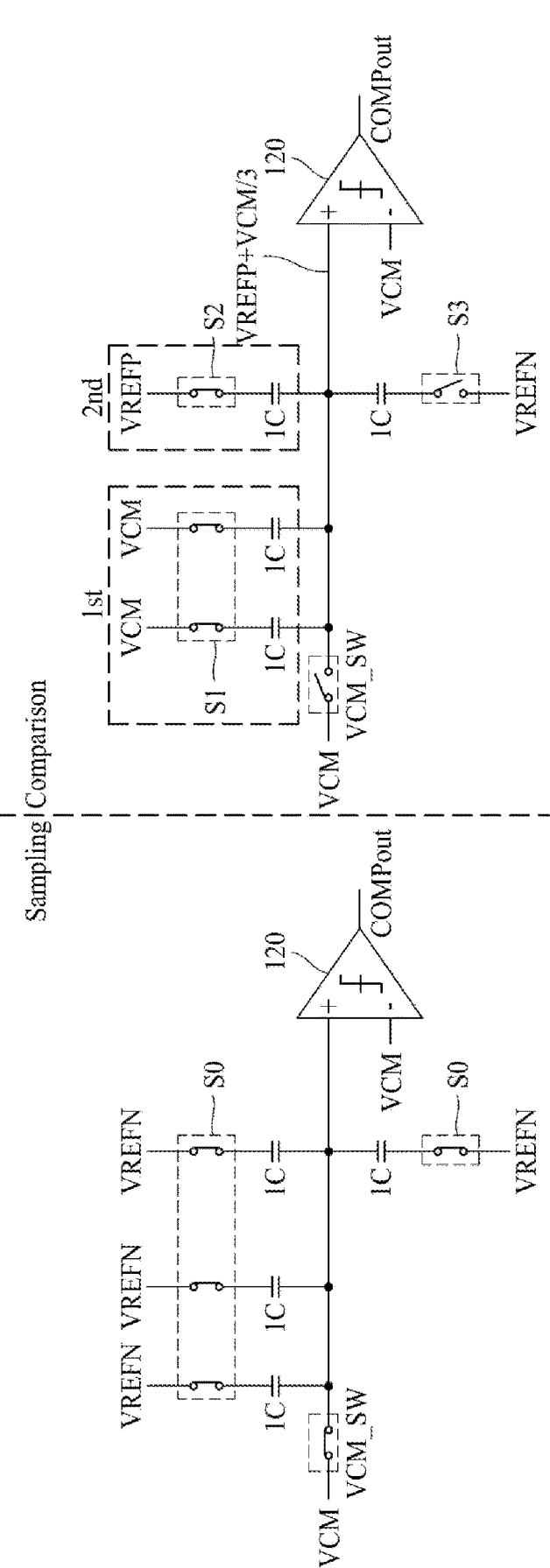
FIGS. 21 and 22 are diagrams illustrating a state of a CDAC top plate when switching to a comparison phase in a case of an NMOS common switch and a low input voltage in an embodiment of the present disclosure.
Figure 22:
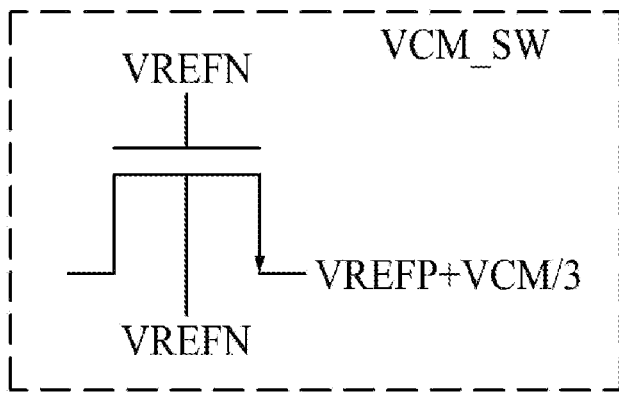
Figure 23:
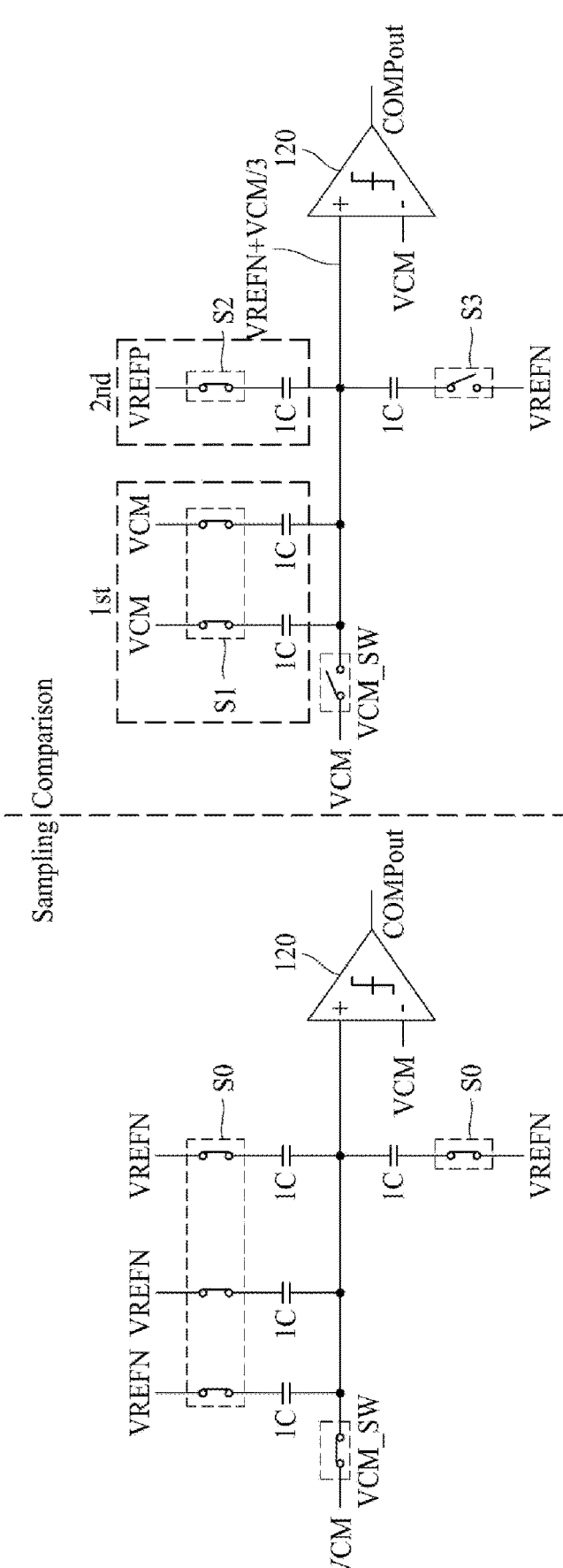
FIGS. 23 and 24 are diagrams illustrating a state of a CDAC top plate when switching to a comparison phase in a case of an NMOS common switch and a high input voltage in an embodiment of the present disclosure.
Figure 24:
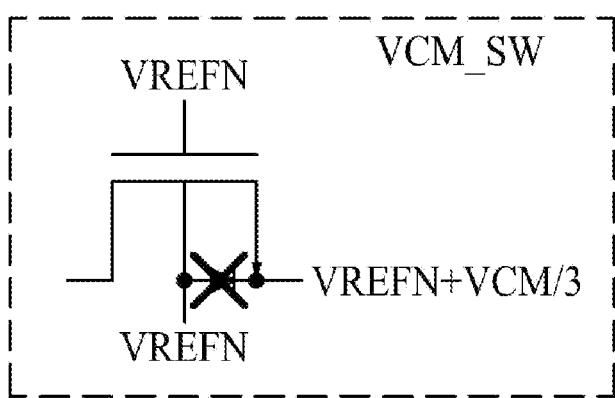

FIG. 18 is an equivalent circuit diagram showing a switch operation of a CDAC circuit according to an embodiment of the present disclosure, FIG. 19 is a diagram showing a configuration of a control signal generator of a SAR control logic circuit according to an embodiment of the present disclosure, and FIG. 20 is a timing diagram of control signals according to an embodiment of the present disclosure. FIGS. 21 and 22 are diagrams illustrating a state of a CDAC top plate when switching to a comparison phase in a case of an NMOS common switch and a low input voltage in an embodiment of the present disclosure, and FIGS. 23 and 24 are diagrams illustrating a state of a CDAC top plate when switching to a comparison phase in a case of an NMOS common switch and a high input voltage in an embodiment of the present disclosure.

Referring to FIGS. 18 to 24, the switches S0, S1, S3, and VCM_SM of the CDAC circuit may perform the switch operations in the sampling phase and the comparison phase in response to control of a SAR control logic circuit 130B.

In the sampling phase, the sampling switch S0 and the common switch VCM_SW may be turned on, so that each of the capacitors 1C, 2C, . . . , $2^{n-3}C$, and $2^{n-2}C$ may be charged with the charges based on the input voltage VIN.

The common switch VCM_SW according to one embodiment may use the NMOS switch.

When switching from the sampling phase to the comparison phase, the sampling switch S0 and the common switch VCM_SW may be turned off, and the first switches S1 that apply the common mode voltage VCM to the unit capacitors 1C, the second switches S2 that apply the first reference voltage VREFP to the half of the equally dividing capacitors $2\times1C$, $2\times2C$, . . . , $2\times2^{n-4}C$, and $2\times2^{n-3}C$, and the third switches S3 that apply the second reference voltage VREFN to the other half may be sequentially turned on based on the specific timing sequence in response to the first-first, second-xth (x is the natural number), and third-xth control signals S1_S, S2_xS, and S3_xS.

The first switches S1 may be first turned on in response to the first-first control signal S1_S, and then the second and third switches S2 and S3 may be sequentially turned on in response to the second-xth and third-xth control signals S2_xS and S3_xS in the ascending order of the capacitance.

The SAR control logic circuit 130A according to one embodiment may include the SAR logic circuit 132 and a control signal generator 133B.

The SAR logic circuit 132 may generate and output the first to third control signals S1, S2, and S3 and the synchronization signal Synch.

The control signal generator 133B may receive the first to third control signals S1, S2, and S3 and the synchronization signal Synch from the SAR logic circuit 132 and generate and output the first-first, second-xth, and third-xth switching control signals S1_S, S2_xS, and S3_xS.

The first D-flip-flop 134 of the control signal generator 133B may output the first-first switching control signal S1_S corresponding to the first control signal S1 in response to the synchronization signal Synch.

The second D-flip-flop 136 of the control signal generator 133B may output the second control signal S2 in response to the synchronization signal Synch, and may sequentially output the second-first, second-second, second-third, . . . switching control signals S2_1S, S2_2S, S2_3S, . . . via the plurality of serially connected delays D21, D22, D23, . . . , respectively.

The second D-flip-flop 138 of the control signal generator 133B may output the third control signal S3 in response to the synchronization signal Synch, and may sequentially output the third-first, third-second, third-third, . . . switching control signals S3_1S, S3_2S, S3_3S, . . . via the remaining delays D32, D33, . . . excluding the first delay D31 among the plurality of serially connected delays D31, D32, D33, . . . , respectively.

The control signal generator 133B may output the first-first switching control signal S1_S of the turn-on level at the first timing t1.

The control signal generator 133B may output the second-first switching control signal S2_1S of the turn-on level at the second timing t2.

The control signal generator 133B may output the second-second switching control signal S2_2S and the third-first switching control signal S3_1S of the turn-on level at the third timing t3. The control signal generator 133 may simultaneously output the second-second switching control signal S2_2S and the third-first switching control signal S3_1S or output the signals at the different timings.

At the first timing t1, the first switches S1 that apply the common mode voltage VCM to the unit capacitors 1C may be turned on.

At the second timing t2, the second switch (second-first switch) S2 that applies the first reference voltage VREFP to the one 1C equally dividing capacitor may be turned on by the second-first switching control signal S2_1S.

At the third timing t3, the second switch (second-second switch) S2 that applies the second reference voltage VREFN to the other 1C equally dividing capacitor may be turned on by the second-second switching control signal S2_2S, and the third switch (third-first switch) S3 that applies the first reference voltage VREFP to the one 2C equally dividing capacitor may be turned on by the third-first switching control signal S3_1S.

In such order, the second switch S2 that applies the first reference voltage VREFP to one of the pair of $2^{n-4}$C equally dividing capacitors and the third switch S3 that applies the second reference voltage VREFN to one of the pair of $2^{n-3}$C equally dividing capacitors may be simultaneously turned on, and then the third switch S3 that applies the first reference voltage VREFP to one of the pair of $2^{n-3}$C equally dividing capacitors may be turned on.

In the SAR control logic circuit 130B according to one embodiment, the common switch VCM_SW is the PMOS switch, and when switching from the sampling phase to the comparison phase, the first switches S1 that apply the common mode voltage VCM to the unit capacitors 1C may be turned on at the first timing, the second_first switch that applies the first reference voltage VREFP to one of the pair of first equally dividing capacitors may be turned on at the second timing, and a third_(N−2)th switch that applies the second reference voltage VREFN to one of the pair of N−2 equally dividing capacitors and a second_(N−1)th switch that applies the first reference voltage VREFP to one of the pair of N−1 equally dividing capacitors may be turned on at the Nth (N is the integer greater than 2) timing.

Referring to FIGS. 21 to 24, the common switch VCM_SW may use the NMOS switch.

Referring to FIGS. 21 and 22, in the sampling phase, the common switch VCM_SW may be turned on and the sampling switch S0 may be turned on to sample the lowest voltage applied to the input voltage VIN, for example, the second reference voltage VREFN, and store the sampled voltage in the capacitor array.

When switching from the sampling phase to the comparison phase, the common switch VCM_SW and the sampling switch S0 may be turned off, and the first switch S1 may be turned at the first timing t1, so that the common mode voltage VCM may be applied to the unit capacitors 1C.

At the second timing t2, the second-first switch S2 may be turned on, so that the first reference voltage VREFP may be applied first to one of the pair of 1C equally dividing capacitors. In this case, the "VREFP+VCM/3" voltage may be generated at the top plate of the CDAC circuit connected to the first input (+) terminal of the comparator 120.

The NMOS common switch VCM_SW may stably maintain the turn-off state because the VREFN is applied to the gate thereof as the turn-off voltage and the source potential thereof becomes the "VREFP+VCM/3".

Accordingly, the charges stored in the capacitor array of the CDAC based on the input voltage (VIN=VREFN) that is low in the sampling phase may be minimized or prevented from being lost via the NMOS common switch VCM_SW that is turned off when switching to the comparison phase.

Referring to FIGS. 23 and 24, in the sampling phase, the common switch VCM_SW may be turned on and the sampling switch S0 may be turned on to sample the highest voltage applied to the input voltage VIN, for example, the first reference voltage VREFP, and store the sampled voltage in the capacitor array.

When switching from the sampling phase to the comparison phase, the common switch VCM_SW and the sampling switch S0 may be turned off, and the first switch S1 may be turned on at the first timing t1, so that the common mode voltage VCM may be applied to the unit capacitors 1C.

At the second timing t2, the second-first switch S3 may be turned on, so that the first reference voltage VREFP may be applied first to one of the pair of 1C equally dividing capacitors. In this case, the "VREFN+VCM/3" voltage may be generated at the top plate of the CDAC circuit connected to the first input (+) terminal of the comparator 120.

The NMOS common switch VCM_SW may stably maintain the turn-off state because the VREFN is applied to the gate thereof as the turn-off voltage and the drain potential thereof becomes the "VREFN-VCM/3".

Accordingly, the charges stored in the capacitor array of the CDAC based on the input voltage (VIN=VREFP) that is high in the sampling phase may be minimized or prevented from being lost via the NMOS common switch VCM_SW that is turned off when switching to the comparison phase.

Figure 25:
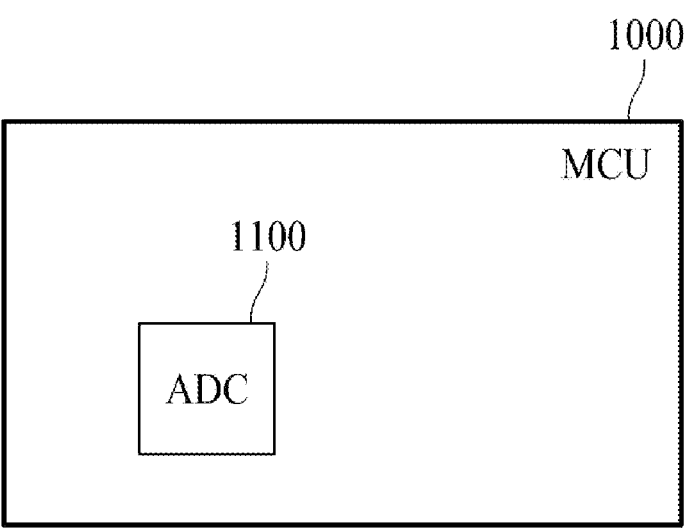
FIG. 25 is a block diagram showing a semiconductor device including an ADC according to an embodiment of the present disclosure.

FIG. 25 is a block diagram showing a semiconductor device including an ADC according to an embodiment of the present disclosure.

Referring to FIG. 25, in one embodiment, a semiconductor device 1000 may include an ADC 1100 according to an embodiment to convert the input analog signal into the digital data and use the digital data.

For example, the semiconductor device 1000 may be one of various semiconductor devices such as a micro controller unit (MCU), a processor, a power management integrated circuit (PMIC), a memory, and the like included in a device such as a computer, a smartphone, a tablet, and the like.

Any one of the SAR ADCs described in FIGS. 1 to 24 may be applied as the ADC 1100 according to one embodiment. Accordingly, the ADC 1100 may use the SAR ADC according to the embodiment described above to minimize or prevent the charges in the CDAC from being lost via the common switch that is turned off when switching from the sampling phase to the comparison phase, thereby converting the input voltage into the accurate digital data and output the digital data. Therefore, the semiconductor device 1100 may ensure operational reliability using the accurate digital data.

Figure 26:
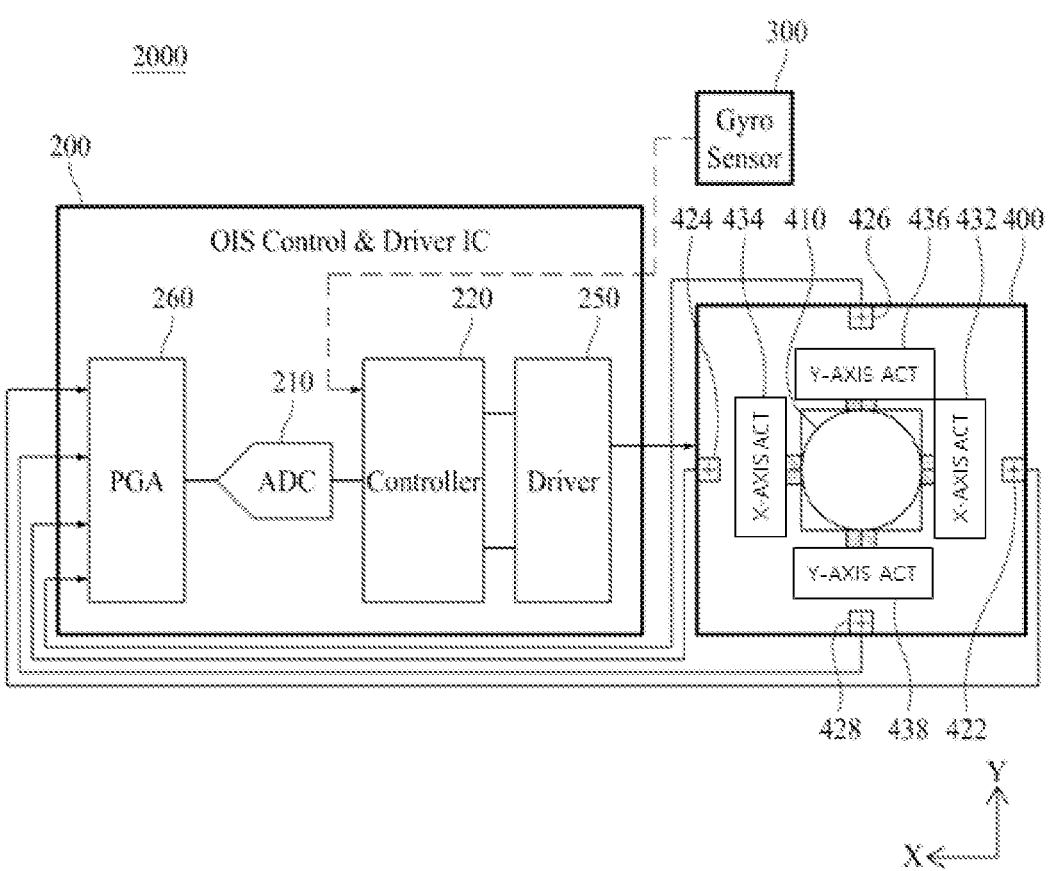
FIG. 26 is a block diagram showing a configuration of a camera module including an ADC according to an embodiment of the present disclosure.

FIG. 26 is a block diagram showing a configuration of a camera module including an ADC according to an embodiment of the present disclosure.

Referring to FIG. 26, a camera module 2000 according to one embodiment may include an actuator module 400, an optical image stabilization (OIS) control driver 200, and a gyro sensor 300.

The camera module may further include a lens module 410 and an image sensor module (not shown). The lens module 410 may be coupled to the actuator module 400 and may be moved by driving the actuator module 400.

The lens module 410 may include a plurality of lenses and may collect incident light and radiate the light onto a sensor surface of an image sensor. The image sensor module may separate light that is reflected from an object, collected via the lens module, and incident into R/G/B (Red, Green, Blue) colors, and sense an optical signal of each color incident in each pixel and convert the sensed signal into an electrical signal to sense an image.

The actuator module 400 may include a plurality of X-axis and Y-axis actuators (ACT) 432, 434, 436, and 438 that are operated (move) based on an actuator driving signal supplied from the OIS control driver 200 and move the lens module 410 in X-axis and Y-axis directions, respectively. The plurality of actuators 432, 434, 436, and 438 may be operated by individually receiving a plurality of actuator driving signals from the OIS control driver 200. The X-axis direction and the Y-axis direction may be defined as a first direction and a second direction among horizontal directions perpendicular to a direction of an optical axis (a Z-axis) of the lens module 410, respectively.

Each of the plurality of actuators 432, 434, 436, and 438 may move the lens module 410 by generating an electro-magnetic force between a coil and a magnet. The plurality of actuator driving signals may be current signals applied to the coils of the plurality of actuators 432, 434, 436, and 438. The plurality of actuators 432, 434, 436, and 438 may be one of actuators of various types such as a voice coil motor (VCM) type, a shape memory alloy (SMA) type, and a ball type.

The plurality of actuators 432, 434, 436, and 438 may perform an OIS function of canceling an angle change of the camera module caused by hand tremor by moving the lens module 410 under control of the OIS control driver 200. The OIS function may be expressed as an anti-hand tremor function, an image stabilization function, or a motion compensation function.

The actuator module 400 may include a plurality of hall sensors 422, 424, 426, and 428 that respectively sense locations of the plurality of actuators 432, 434, 436, and 438. The plurality of hall sensors 422, 424, 426, and 428 may individually sense the locations of the plurality of actuators 432, 434, 436, and 438 moving in the X-axis and Y-axis directions, respectively, and output the plurality of sensed location signals to the OIS control driver 200. For example, the hall sensors 422, 424, 426, and 428 may sense a magnetic field strength of the magnets caused by the movement of the actuators 432, 434, 436, and 438 to sense the locations of the actuators 432, 434, 436, and 438. The hall sensors 422, 424, 426, and 428 may be defined as location sensors.

The gyro sensor 300 may sense the angle change of the camera module caused by the hand tremor, convert the angle change into angular velocity information, and output the angular velocity information to the OIS control driver 200. The gyro sensor 300 may be defined as a motion sensor or an angular velocity sensor.

The OIS control driver 200 may correct the hand tremor by cancelling the angle change of the camera module caused by the hand tremor sensed via the gyro sensor 300 by moving the lens module 410 in an opposite direction via operating the plurality of actuators 432, 434, 436, and 438. The OIS control driver 200 may be implemented as an integrated circuit (IC) by integrating a controller 220 and an actuator driver 250 together. The OIS control driver 200 may be defined as a stabilization controller, an OIS controller, or an OIS driver.

The OIS control driver 200 may include analog front-end (AFE) circuits 260 and 210, the controller 220, and the driver 250.

The analog front-end (AFE) circuits 260 and 210 may amplify fine sensing signals respectively output from the plurality of hall sensors 422, 424, 426, and 428, convert the amplified sensing signals into digital sensing data, and output the digital sensing data.

The analog front-end circuits 260 and 210 may include a programmable gain amplifier (PGA) 260 and an ADC 210.

The PGA 260 may individually amplify the plurality of sensing signals output from the plurality of hall sensors 422, 424, 426, and 428. The PGA 260 may sequentially output the plurality of amplified sensing signals to the ADC 210 via a multiplexer (MUX).

The ADC 210 may sequentially convert the sensing signals of the plurality of channels amplified via the PGA 260 into the digital sensing data and output the digital sensing data to the controller 220. The SAR ADC according to the embodiment described in FIGS. 1 to 24 may be applied to the ADC 210 according to one embodiment. Accordingly, the ADC 210 may use the SAR ADC according to the embodiment described above to minimize or prevent the charges in the CDAC from being lost via the common switch that is turned off when switching from the sampling phase to the comparison phase, thereby converting the input voltage into the accurate digital data and outputting the accurate digital data.

The controller 220 may calculate a target location value using the angular velocity information supplied from the gyro sensor 300, calculate error values between the calculated target location value and the sensing data of the plurality of channels supplied from the ADC 210, and generate control signals of the plurality of channels for correcting the calculated error values and output the control signals to the driver 250. A signal processor such as a microcontroller unit (MCU), a central processing unit (CPU), or a digital signal processor (DSP) may be used as the controller 220.

The driver 250 may individually operate the plurality of actuators 432, 434, 436, and 438 by generating the actuator driving signals of the plurality of channels based on the control signals of the plurality of channels supplied from the controller 220. The actuator driving signal may be generated in a form of a constant current signal or a pulse width modulation (PWM) signal. The driver 250 may correct the hand shake by moving the lens module 410 by operating the plurality of actuators 432, 434, 436, and 438 based on the actuator driving signals of the plurality of channels.

As described above, the SAR ADC according to one embodiment of the present disclosure may control the switching timing sequence of the switches that apply the common mode voltage and the first and second reference voltages when switching from the sampling phase to the comparison phase in the specific order depending on the channel type of the switch, thereby minimizing or preventing the charges charged in the capacitor array of the CDAC circuit from being lost via the common switch that is turned off.

The SAR ADC according to the embodiment of the present disclosure may minimize or prevent the charge loss of the capacitor array when starting the comparison phase, thereby preventing the error of the digital code determined via the comparator and outputting the accurate digital data.

The semiconductor device using the SAR ADC according to the embodiment of the present disclosure may improve the operational reliability by receiving the accurate digital data via the SAR ADC.

Those skilled in the art to which the present disclosure belongs will understand that the present disclosure described above may be implemented in other specific forms without changing a technical idea or essential features thereof.

Therefore, the embodiments described above should be understood in all respects as illustrative and not restrictive. The scope of the present disclosure is indicated by the patent claims to be described later rather than the detailed description above, and the meaning and scope of the patent claims and all changes or modified forms derived from the equivalent concept must be interpreted to be included in the scope of the present disclosure.

What is claimed is:

1. An analog-to-digital converter comprising:
a digital-to-analog converter (DAC) circuit including a capacitor digital-to-analog converter (CDAC) circuit including a capacitor array, and a resistor digital-to-analog converter (RDAC) circuit including a resistor string;
a comparator configured to compare an output voltage of the DAC circuit with a common mode voltage and output a comparison result; and
a control logic circuit configured to:
control a switch operation of the DAC circuit and a comparison operation of the comparator in a sampling phase and a comparison phase;
output digital data based on the comparison result of the comparator; and
control switches configured to apply the common mode voltage and first and second reference voltages to the capacitor array in the CDAC circuit in response to that the sampling phase is switched to the comparison phase based on a specific switching timing sequence,
wherein the control logic circuit is configured to apply the common mode voltage to a first plate of the capacitor array in the sampling phase, and set the specific switching timing sequence of the switches differently depending on a channel type of a common switch turned off in the comparison phase.

2. The analog-to-digital converter of claim 1, wherein the control logic circuit is configured to sequentially turn on the switches from a switch connected to a capacitor corresponding to a least significant bit (LSB) in the CDAC circuit to a switch connected to a capacitor corresponding to a most significant bit (MSB) in response to that the sampling phase is switched to the comparison phase.

3. The analog-to-digital converter of claim 1, wherein the control logic circuit is configured to sequentially turn on the switches from a switch connected to a unit capacitor in the CDAC circuit to a switch connected to a capacitor with a maximum capacitance in response to that the sampling phase is switched to the comparison phase.

4. An analog-to-digital converter, comprising;
a digital-to-analog converter (DAC) circuit including a capacitor digital-to-analog converter (CDAC) circuit including a capacitor array, and a resistor digital-to-analog converter (RDAC) circuit including a resistor string;
a comparator configured to compare an output voltage of the DAC circuit with a common mode voltage and output a comparison result; and
a control logic circuit configured to:
control a switch operation of the DAC circuit in a sampling phase and a comparison operation of the comparator in a comparison phase;
output digital data based on the comparison result of the comparator; and
control switches configured to apply the common mode voltage and first and second reference voltages to the capacitor array in the CDAC circuit in response to that the sampling phase is switched to the comparison phase based on a specific switching timing sequence,
wherein the CDAC circuit includes:
the capacitor array including a plurality of unit capacitors and a plurality of pairs of equally dividing capacitors;
first switches configured to apply the common mode voltage to each of the plurality of unit capacitors;
second switches configured to apply the first reference voltage to one of each pair of equally dividing capacitors;
third switches configured to apply the second reference voltage to the other of each pair of equally dividing capacitors; and
a common switch configured to apply the common mode voltage to a first plate of the capacitor array connected to a first input terminal of the comparator.

5. The analog-to-digital converter of claim 4, wherein the control logic circuit is configured to turn on the first switches and then sequentially turn on the second switches and sequentially turn on the third switches in response to that the sampling phase is switched to the comparison phase.

6. The analog-to-digital converter of claim 5, wherein the control logic circuit is configured to turn on one second switch configured to apply the first reference voltage and one third switch configured to apply the second reference voltage to one of the pairs of equally dividing capacitors simultaneously or at different timings in response to that the sampling phase is switched to the comparison phase.

7. The analog-to-digital converter of claim 5, wherein the control logic circuit includes:
a logic circuit configured to generate and output first to third control signals and a synchronization signal; and
a control signal generator configured to generate first switching control signals for controlling the first switches, second switching control signals for controlling the second switches, and third switching control signals for controlling the third switches using the first to third control signals and the synchronization signal, and output the first switching control signals, the second switching control signals, and the third switching control signals to the CDAC circuit.

8. The analog-to-digital converter of claim 7, wherein the control signal generator includes:
a first D-flip-flop configured to output the first control signal as the first switching control signals in response to the synchronization signal;

a second D-flip-flop configured to output the second control signal in response to the synchronization signal;

a plurality of second delays configured to sequentially delay the output signals of the second D-flip-flop and sequentially output the second switching control signals;

a third D-flip-flop configured to output the third control signal in response to the synchronization signal; and a plurality of third delays configured to sequentially delay the output signals of the third D-flip-flop and sequentially output the third switching control signals.

9. The analog-to-digital converter of claim 4, wherein in response to that the sampling phase is switched to the comparison phase, the control logic circuit is configured to:

turn on a second switch and a third switch respectively connected to one of the plurality of pairs of equally dividing capacitors at different timings; and turn on the second switch simultaneously with a third switch connected to a pair of equally dividing capacitors adjacent to the one of the plurality of pairs of equally dividing capacitors; or turn on the third switch simultaneously with thea second switch connected to the pair of equally dividing capacitors adjacent to the one of the plurality of pairs of equally dividing capacitors.

10. The analog-to-digital converter of claim 4, wherein in response to that the sampling phase is switched to the comparison phase, the control logic circuit is configured to:

turn on the first switches configured to apply the common mode voltage to each of the plurality of unit capacitors at a first timing; and turn on a second_Nth switch configured to apply the first reference voltage to one of an Nth pair of the equally dividing capacitors, and a third_Nth switch configured to apply the second reference voltage to the other of the Nth pair of the equally dividing capacitors at an N+1th (N is a positive integer) timing.

11. The analog-to-digital converter of claim 10, wherein the common switch is a CMOS switch.

12. The analog-to-digital converter of claim 4, wherein in response to that the sampling phase is switched to the comparison phase, the control logic circuit is configured to:

turn on the first switches configured to apply the common mode voltage to the each of the unit capacitors at a first timing;

turn on a third_first switch configured to apply the second reference voltage to one of a first pair of the equally dividing capacitors at a second timing; and turn on a second_(N−2)th switch configured to apply the first reference voltage to one of an N−2th pair of the equally dividing capacitors and a third_(N−1)th switch configured to apply the second reference voltage to one of an N−1th pair of the equally dividing capacitors at an Nth (N is an integer greater than 2) timing.

13. The analog-to-digital converter of claim 12, wherein the control logic circuit is configured to turn on a last second switch configured to apply the first reference voltage to one of a last pair of the equally dividing capacitors at a last timing in response to that the sampling phase is switched to the comparison phase.

14. The analog-to-digital converter of claim 12, wherein the common switch is a PMOS switch.

15. The analog-to-digital converter of claim 4, wherein in response to that the sampling phase is switched to the comparison phase, the control logic circuit is configured to:

turn on the first switches configured to apply the common mode voltage to each of the plurality of the unit capacitors at a first timing;

turn on a second_first switch configured to apply the first reference voltage to one of a first pair of the equally dividing capacitors at a second timing; and turn on a third_(N−2)th switch configured to apply the second reference voltage to one of an N−2th pair of the equally dividing capacitors and a second_(N−1)th switch configured to apply the first reference voltage to one of an N−1th pair of the equally dividing capacitors at an Nth (N is an integer greater than 2) timing.

16. The analog-to-digital converter of claim 15, wherein the control logic circuit is configured to turn on a last third switch configured to apply the second reference voltage to one of a last pair of the equally dividing capacitors at a last timing in response to that the sampling phase is switched to the comparison phase.

17. The analog-to-digital converter of claim 15, wherein the common switch is an NMOS switch.

18. An analog-to-digital converter comprising:

a digital-to-analog converter (DAC) circuit including a capacitor digital-to-analog converter (CDAC) circuit and a resistor digital-to-analog converter (RDAC) circuit;

a comparator configured to compare an output voltage of the DAC circuit with a common mode voltage and output a comparison result; and a control logic circuit configured to:

control a switch operation of the DAC circuit and a comparison operation of the comparator in a sampling phase and a comparison phase;

output digital data based on the comparison result of the comparator; and sequentially turn on switches configured to apply the common mode voltage and first and second reference voltages to a capacitor array in the CDAC circuit in response to that the sampling phase is switched to the comparison phase from a switch connected to a minimum capacitor having a minimum capacitance to a switch connected to a maximum capacitor having a maximum capacitance.

* * * * *